US012813239B2

(12) United States Patent
Yamaha

(10) Patent No.: US 12,813,239 B2
(45) Date of Patent: Nov. 24, 2026

(54) INTEGRATED LINE-AND-VIA STRUCTURE HAVING AN INTERVENING METALLIC CAPPING PLATE WITH VARIABLE THICKNESS

(71) Applicant: Sandisk Technologies, Inc., Milpitas, CA (US)

(72) Inventor: Takashi Yamaha, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 518 days.

(21) Appl. No.: 18/355,029

(22) Filed: Jul. 19, 2023

(65) Prior Publication Data

US 2024/0213094 A1 Jun. 27, 2024

Related U.S. Application Data

(60) Provisional application No. 63/477,073, filed on Dec. 23, 2022.

(51) Int. Cl.
*H10W 20/00* (2026.01)
*H10B 43/27* (2023.01)
(Continued)

(52) U.S. Cl.
CPC .......... *H10W 20/069* (2026.01); *H10B 43/27* (2023.02); *H10W 20/063* (2026.01);
(Continued)

(58) Field of Classification Search
CPC ..... H10W 20/069–0696; H10W 20/42; H10W 20/032–038; H10W 20/425; H10B 41/27; H10B 43/27
See application file for complete search history.

(56) References Cited

U.S. PATENT DOCUMENTS 4,536,951 A * 8/1985 Rhodes ................. H10W 20/42 438/669
6,133,635 A * 10/2000 Bothra ................ H10W 20/063 438/669
(Continued)

OTHER PUBLICATIONS

IPRP-WO—Notification Concerning Transmittal of International Preliminary Report on Patentability and Written Opinion of the International Searching Authority for International Patent Application No. PCT/US2023/077466, Mailed Jul. 3, 2025, 7 pages.
(Continued)

*Primary Examiner* — Younes Boulghassoul
(74) *Attorney, Agent, or Firm* — THE MARBURY LAW GROUP PLLC

(57) ABSTRACT

An integrated line-and-via structure includes a metal line structure including a first metal and having a pair of lengthwise metal line sidewalls that laterally extend along a first horizontal direction, a metallic capping plate including a metallic capping material and overlying the metal line structure and having a pair of lengthwise metal cap sidewalls that are vertically coincident with the pair of lengthwise metal line sidewalls, and a metal via structure including a second metal and having a pair of lengthwise metal via sidewalls that is vertically coincident with the pair of lengthwise metal cap sidewalls and having a lateral extent along the first horizontal direction that is less than a lateral extent of the metal line structure along the first horizontal direction.

5 Claims, 22 Drawing Sheets

(51) Int. Cl.
*H10W 20/41* (2026.01)
*H10W 20/42* (2026.01)

(52) U.S. Cl.
CPC ... *H10W 20/0633* (2026.01); *H10W 20/0693* (2026.01); *H10W 20/42* (2026.01); *H10W 20/425* (2026.01)

(56) References Cited

U.S. PATENT DOCUMENTS 7,713,818 B2 5/2010 Chan
7,733,685 B2 6/2010 Scheuerlein et al.
7,981,592 B2 7/2011 Chan
8,080,443 B2 12/2011 Chen et al.
10,115,735 B2 10/2018 Amano et al.
10,515,897 B2 12/2019 Nishikawa et al.
10,515,907 B2 12/2019 Fujita et al.
10,818,545 B2 10/2020 Shimabukuro et al.
11,355,437 B2 * 6/2022 Cui .................... H10W 20/056
11,430,736 B2 8/2022 Said et al.
11,637,038 B2 4/2023 Amano et al.
2013/0168867 A1 * 7/2013 Shim .................. H10W 20/063 438/626
2015/0056800 A1 * 2/2015 Mebarki ............ H10W 20/069 438/666
2018/0247954 A1 8/2018 Amano et al.
2018/0331118 A1 11/2018 Amano
2019/0355663 A1 11/2019 Nishikawa et al.
2019/0355672 A1 11/2019 Fujita et al.
2020/0006131 A1 1/2020 Shimabukuro et al.
2020/0027782 A1 * 1/2020 Jiang ...................... H10D 1/696
2020/0135459 A1 * 4/2020 Jiang .................. H10P 14/6529
2020/0350206 A1 * 11/2020 Ren .................... H10W 20/063
2020/0395299 A1 12/2020 Lee et al.
2021/0043643 A1 2/2021 Lu et al.
2021/0082804 A1 * 3/2021 Wu .................... H10W 20/063
2021/0125864 A1 * 4/2021 Jiang .................. H10W 20/069
2021/0242237 A1 8/2021 Lim et al.
2022/0059462 A1 * 2/2022 Said ...................... H10B 43/27
2022/0230917 A1 7/2022 Amano et al.
2022/0310506 A1 * 9/2022 Park .................... H10W 20/037
2022/0399232 A1 * 12/2022 Amano .................. H10B 43/10

OTHER PUBLICATIONS

ISR—Notification of Transmittal of The International Search Report and Written Opinion of the International Searching Authority for International Patent Application No. PCT/US2023/077466, mailed Feb. 13, 2024, 8 pages.
U.S. Appl. No. 17/479,573, filed Sep. 20, 2021, SanDisk Technologies LLC.
U.S. Appl. No. 17/479,637, filed Sep. 20, 2021, SanDisk Technologies LLC.
U.S. Appl. No. 17/509,323, filed Oct. 25, 2021, SanDisk Technologies LLC.
U.S. Appl. No. 17/566,262, filed Dec. 30, 2021, SanDisk Technologies LLC.
U.S. Appl. No. 17/821,659, filed Aug. 23, 2022, SanDisk Technologies LLC.
U.S. Appl. No. 18/059,698, filed Nov. 29, 2022, SanDisk Technologies LLC.
Luere, O. et al., "Poly-Si/TiN/Mo/HfO2 gate stack etching in high-density plasmas," Journal of Vacuum Science & Technology, vol. B29, No. 1, pp. 011024 (2011); https://doi.org/10.1116/1.3533939.
Pacco, A. et al., "Controlled cobalt recess for advanced interconnect metallization," Microelectronic Engineering vol. 217, Sep. 15, 2019, 111131; https://doi.org/10.1016/j.mee.2019.111131.
Wang, Z. et al., "In operando x-ray photoelectron spectroscopy study of mechanism of atomic layer etching of cobalt," J. Vac. Sci. Technol., vol. A 38, pp. 022611 (2020); doi: 10.1116/1.5138989.

* cited by examiner

INTEGRATED LINE-AND-VIA STRUCTURE HAVING AN INTERVENING METALLIC CAPPING PLATE WITH VARIABLE THICKNESS

FIELD

The present disclosure relates generally to the field of semiconductor devices, and particular to a metal interconnect structure including a self-aligned line-and-via structure and methods of manufacturing the same.

BACKGROUND

Metal interconnect structures are employed top provide electrical connection to and between semiconductor devices in a semiconductor die. Metal interconnect structures include metal line structures and metal via structures. As lateral dimensions of metal interconnect structures decrease, alignment between the metal line structures and the metal via structures becomes more difficult.

SUMMARY

According to an embodiment of the present disclosure, a structure comprising an integrated line-and-via structure located over a substrate is provided. The integrated line-and-via structure comprises: a metal line structure comprising a first metal and having a pair of lengthwise metal line sidewalls that laterally extend along a first horizontal direction; a metallic capping plate comprising a metallic capping material and overlying the metal line structure and having a pair of lengthwise metal cap sidewalls that are vertically coincident with the pair of lengthwise metal line sidewalls; and a metal via structure comprising a second metal and having a pair of lengthwise metal via sidewalls that is vertically coincident with the pair of lengthwise metal cap sidewalls and having a lateral extent along the first horizontal direction that is less than a lateral extent of the metal line structure along the first horizontal direction.

According to another embodiment of the present disclosure, a method of forming an interconnect structure comprises forming an initial line-and-space-pattern etch mask over a first metal layer; etching portions of the first metal layer exposed by the initial line-and-space-pattern etch mask to form metal line structures; slimming the initial line-and-space-pattern etch mask to form a line-and-space-pattern etch mask over the metal line structures; forming a dielectric material layer around the metal line structures and the line-and-space-pattern etch mask such that top ends of the line-and-space-pattern etch mask are exposed in a top surface of the dielectric material layer; forming a hard mask layer over the dielectric material layer; forming at least one line shaped opening in the hard mask layer to expose a first portion of the line-and-space-pattern etch mask; removing the first portion of the line-and-space-pattern etch mask through the line shaped opening by selective etching to form a via shaped opening expose a top surface of a first metal line structure of the metal line structures; and forming a dual damascene metal line and via structure in the line and via shaped openings in contact with the first metal line structure.

According to another embodiment of the present disclosure, a method of forming a metal interconnect structure is provided. The method comprises: forming a layer stack including a first metal layer comprising a first metal, a metallic capping layer including a metallic capping material, and a second metal layer comprising a second metal over a substrate; forming a via-pattern etch mask over the second metal layer; transferring a pattern in the via-pattern etch mask through the second metal layer by performing a first anisotropic etch process having a first etch chemistry that etches the second metal selective to the metallic capping material, wherein a remaining portion of the second metal layer comprises a metal via structure; forming a line-and-space-pattern etch mask over the metal via structure and the metallic capping layer; and transferring a pattern in the line-and-space-pattern etch mask at least through the metallic capping layer and the first metal layer by performing a second anisotropic etch process, wherein a patterned portion of the metallic capping layer comprises a metallic capping plate and a patterned portion of the first metal layer comprises a metal line structure.

DETAILED DESCRIPTION

Figure 1A:
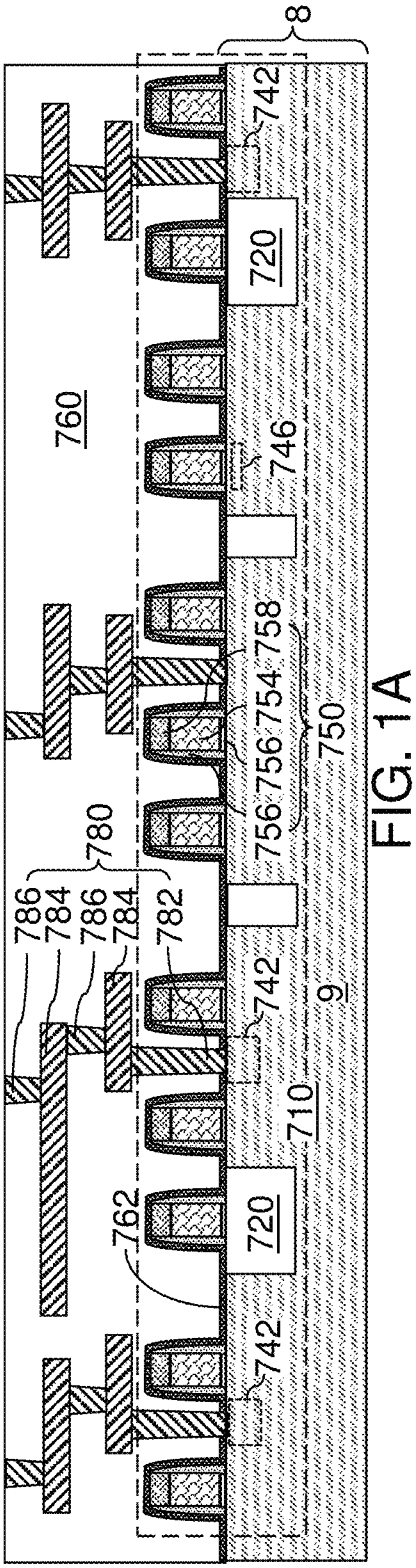
FIGS. 1A and 1B are vertical cross-sectional view of alternative exemplary structures after formation of semiconductor devices and optional metal interconnect structures embedded in dielectric material layers according to an embodiment of the present disclosure.

Embodiments of the present disclosure are directed to integrated line-and-via structures including a metal via structure that overlies a metal line structure. Embodiments of the present disclosure may be employed to provide self-aligned assembly of metal line structures and metal via structures. A non-limiting illustrative example includes self-aligned metal via structures contacting high-density bit lines employed in a three-dimensional memory device. Generally, the integrated line-and-via structures may be employed at any level components of metal interconnect structures in any semiconductor device.

The drawings are not drawn to scale. Multiple instances of an element may be duplicated where a single instance of the element is illustrated, unless absence of duplication of elements is expressly described or clearly indicated otherwise. Ordinals such as “first,” “second,” and “third” are employed merely to identify similar elements, and different ordinals may be employed across the specification and the claims of the instant disclosure. The term “at least one” element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a “contact” between elements refers to a direct contact between elements that provides an edge or a surface shared by the elements. If two or more elements are not in direct contact with each other or among one another, the two elements are “disjoined from” each other or “disjoined among” one another. As used herein, a first element located “on” a second element can be located on the exterior side of a surface of the second element or on the interior side of the second element. As used herein, a first element is located “directly on” a second element if there exist a physical contact between a surface of the first element and a surface of the second element. As used herein, a first element is “electrically connected to” a second element if there exists a conductive path consisting of at least one conductive material between the first element and the second element. As used herein, a “prototype” structure or an “in-process”

structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1A, an exemplary structure according to an embodiment of the present disclosure is illustrated. The exemplary structure includes a substrate 8 and semiconductor devices 710 formed thereupon. The substrate 8 may include a substrate semiconductor layer 9 at least at an upper portion thereof. In one embodiment, the substrate 8 may comprise a silicon wafer and the substrate semiconductor layer 9 may comprise a doped well in the silicon wafer or an epitaxial silicon layer on the silicon wafer. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. In one embodiment, the semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

A dielectric liner 762 (such as a silicon nitride liner that blocks diffusion of mobile ions and/or apply appropriate stress to underlying structures) may be formed over the semiconductor devices 710. Dielectric material layers, which are herein referred to as lower-level dielectric material layers 760, can be formed over the dielectric liner 762 and the semiconductor devices 710. Metal interconnect structures, which are herein referred to as lower-level metal interconnect structures 780, may be formed in the lower-level dielectric material layers 760. The dielectric layer stack including the lower-level dielectric material layers 760 functions as a matrix for lower-level metal interconnect structures 780 that provide electrical wiring to and from the various nodes of the semiconductor devices 710.

The lower-level metal interconnect structures 780 may comprise at least one dielectric material layer in which various elements of the lower-level metal interconnect structures 780 are sequentially formed. Each dielectric material layer may include any of doped silicate glass, undoped silicate glass (i.e., silicon oxide), organosilicate glass, silicon nitride, silicon oxynitride, and dielectric metal oxides (such as aluminum oxide). The lower-level metal interconnect structures 780 may include various device contact via structures 782 (e.g., source and drain electrodes which contact the respective source and drain nodes of the device or gate electrode contacts), lower-level metal line structures 784, and lower-level metal via structures 786. Each of the lower-level metal interconnect structures 780 may include a metallic nitride liner and a metal fill structure.

While an embodiment is descried in which multiple levels of lower-level metal line structures 784 and multiple levels of lower-level metal via structures 786 are employed, alternative embodiments may include or exclude any of the lower-level metal line structures 784 and the lower-level metal via structures 786. Further, while in the embodiment shown in FIG. 1A the semiconductor devices 710 comprise complementary metal-oxide-semiconductor (CMOS) field effect transistors, in alternative embodiments, the semiconductor devices 710 may be replaced with any semiconductor device known in the art.

Figure 1B:
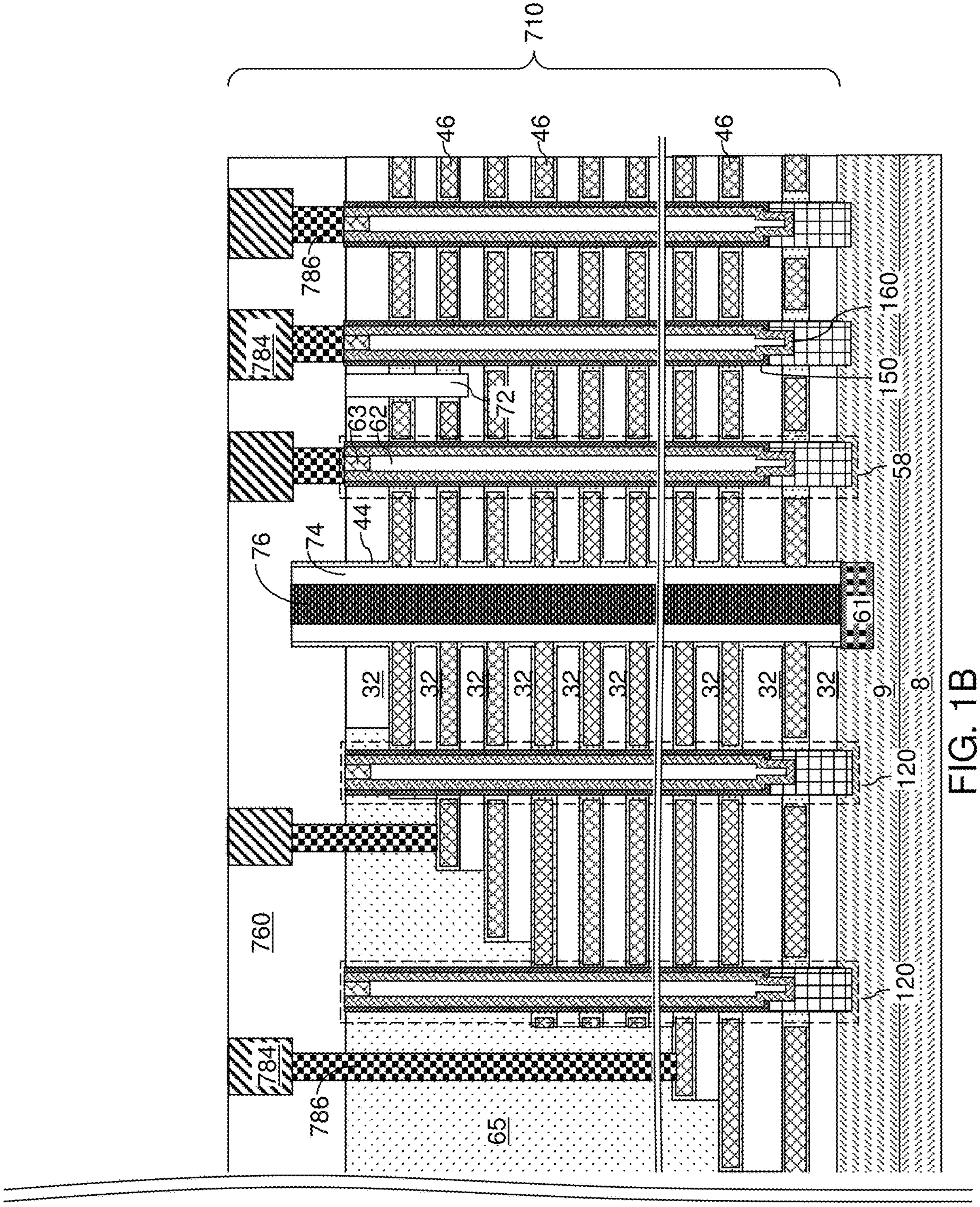

For example, as shown in FIG. 1B, the semiconductor devices 710 may comprise any three-dimensional memory device known in the art, such as a three-dimensional NAND array. The three-dimensional NAND array may include an alternating stack of insulating layers 32 and electrically conductive layers 46 located over the substrate 8. One or more topmost electrically conductive layers 46 comprise drain side select gate electrodes. One or more bottommost electrically conductive layers 46 comprise source side select gate electrodes. The remaining electrically conductive layers comprise word lines. A drain select electrode level dielectric separator 72 may laterally separate the drain side select gate electrodes of adjacent NAND strings.

Memory opening fill structures 58 extend through the alternating stack (32, 46). Each memory opening fill structure comprises a memory film 150, a vertical semiconductor channel 160, a drain region 63 located at the upper portion of the vertical semiconductor channel 160, and an optional dielectric core 62. The memory film may include a tunneling dielectric located surrounding the vertical semiconductor channel, a charge storage layer (e.g., silicon nitride layer) surrounding the tunneling dielectric, and an optional blocking dielectric surrounding the charge storage layer. Optionally, an additional backside blocking dielectric layer 44 may surround the electrically conductive layers 46. Support pillar structures 120 having the same composition as the memory opening fill structures 58 or comprising dielectric pillars may be located in a staircase region of the alternating stack (32, 46). A stepped dielectric layer 65 is located over the staircase region of the alternating stack (32, 46). A doped source region 61 may be located in the substrate semiconductor layer 9. A local source interconnect (e.g., source electrode) 76 may contact the source region 61. A dielectric spacer 74 isolates the local source interconnect 76 from the electrically conductive layers 46.

In the alternative embodiment of FIG. 1B, the lower-level metal interconnect structures 780 may comprise word line contact vias structures and/or drain contact via structures 786, and word line contact lines and/or bit lines 784 which are embedded in the lower-level dielectric material layers 760. Generally, any type of semiconductor device known in the art may be formed over the substrate 8, and in some cases, the substrate 8 may be removed prior to or after formation of the integrated line-and-via structures of the embodiments of the present disclosure.

Figure 2A:
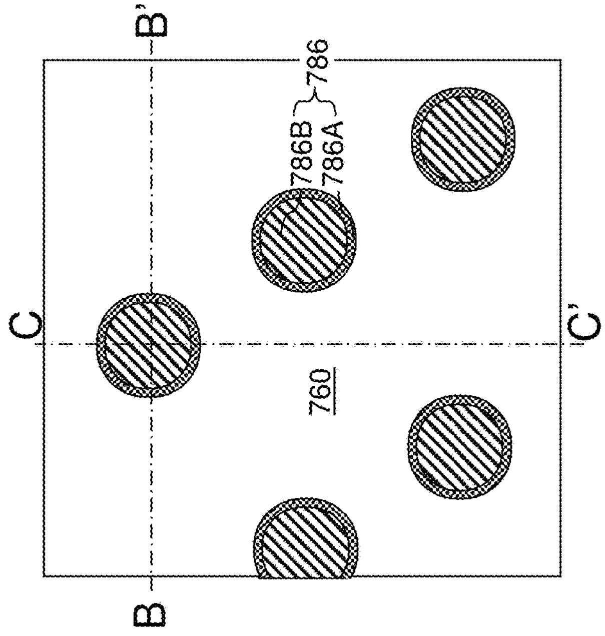
FIG. 2A is a top-down view of a portion of the exemplary structure including a via-level dielectric material layer and metal via structures according to an embodiment of the present disclosure.
Figure 2C:
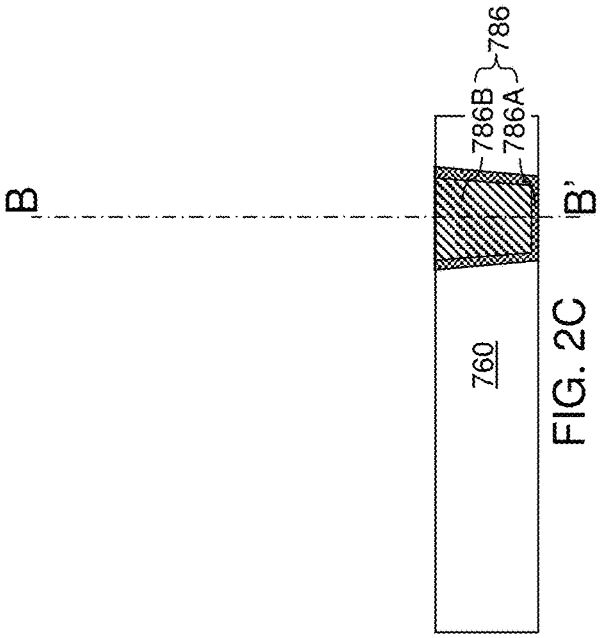
FIG. 2C is a vertical cross-sectional view of the exemplary structure along the vertical plane C-C' of FIG. 2A.
Figure 2B:
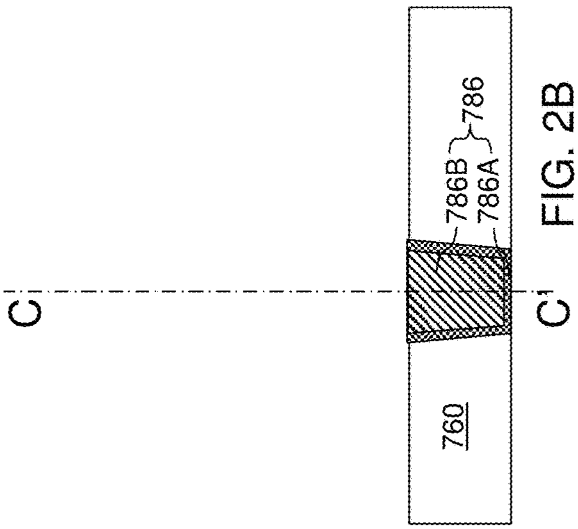
FIG. 2B is a vertical cross-sectional view of the exemplary structure along the vertical plane B-B' of FIG. 2A.

Referring to FIGS. 2A-2C, an upper portion of the exemplary structure in FIG. 1A is illustrated for an embodiment in which a via-level dielectric material layer is formed as a topmost lower-level dielectric material layer 760, and metal via structures 786 are formed as the topmost lower-level metal interconnect structures 780. It should be noted that in an alternative embodiment shown in FIG. 1B, a line-level dielectric material layer may be formed as a topmost lower-level dielectric material layer 760, and metal line structures 784 may be formed as the topmost lower-level metal interconnect structures 780.

The topmost layer portion of the lower-level dielectric material layer 760 (e.g., a via-level dielectric material layer or a line-level dielectric material layer), may be referred to as an underlying dielectric material layer, i.e., a dielectric material layer that underlies the metal interconnect structures to be subsequently formed. In this case, the topmost metal via structures 786 or metal line structures 784 may be referred to as underlying metal structures.

In one embodiment, the metal via structures 786 may be formed, for example, by forming via cavities through the via-level dielectric material layer, by depositing at least one metallic material in the via cavities, and by removing excess portions of the at least one metallic material from above the horizontal plane including the top surface of the via-level dielectric material layer by performing a planarization process such as a chemical mechanical polishing process. In one embodiment, each of the metal via structures 786 embedded in the via-level dielectric material layer may comprise a metallic via liner 786A contacting a sidewall of the via-level dielectric material layer and a metallic via fill material portion 786B that is laterally surrounded by the metallic via liner 786A. The metallic via liner 786A may comprise a metallic barrier material such as TiN, TaN, WN, MoN, TiC, TaC, WC, or a combination thereof. The metallic via fill material portion 786B may comprise a metallic fill material such as W, Ti, Ta, Co, Ru, Mo, Cu, or combinations thereof. Each of the metal via structures 786 may have a surface located within a horizontal plane including a top surface of the via-level dielectric layer (which may be the topmost layer of the lower-level dielectric material layers 760.

Figure 3A:
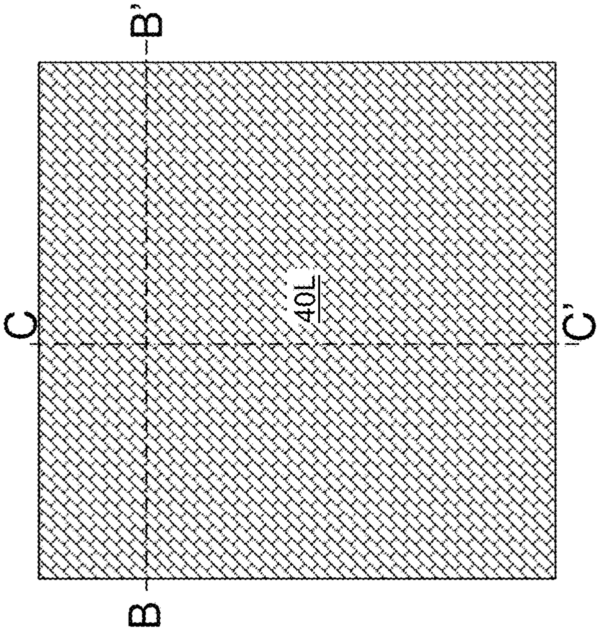
FIG. 3A is a top-down view of a portion of the exemplary structure after formation of a layer stack including a first metal layer, a metallic capping layer, and a second metal layer according to an embodiment of the present disclosure.
Figure 3B:
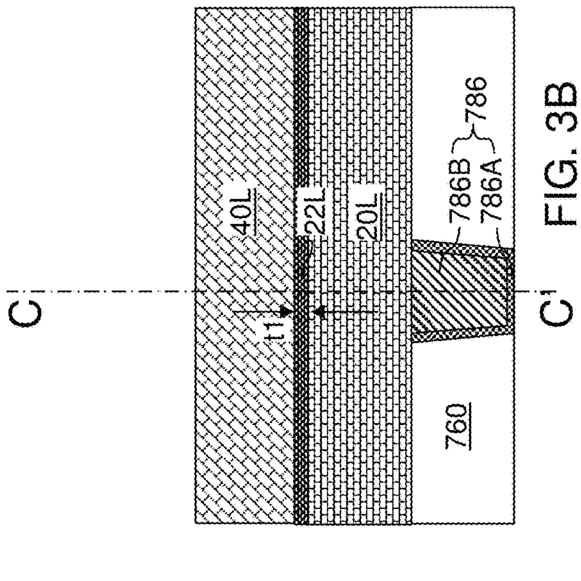
FIG. 3B is a vertical cross-sectional view of the exemplary structure along the vertical plane B-B' of FIG. 3A.
Figure 3C:
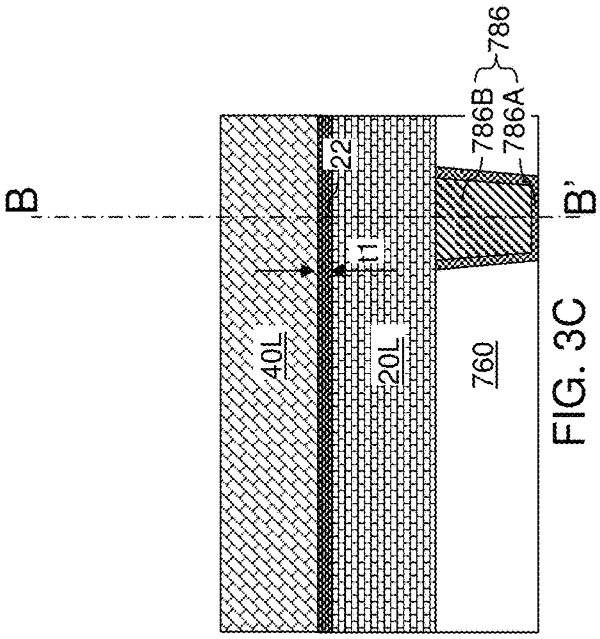
FIG. 3C is a vertical cross-sectional view of the exemplary structure along the vertical plane C-C' of FIG. 3A.

Referring to FIGS. 3A-3C, a layer stack including a first metal layer 20L, a metallic capping layer 22L, and a second metal layer 40L can be deposited over the lower-level dielectric material layers 760 and the metal via structures 786. In an alternative embodiment the first metal layer 20L may comprise a bit line metal layer which will subsequently be patterned into bit lines shown in FIG. 1B.

The first metal layer 20L and the second metal layer 40L comprise and/or consist essentially of a first transition metal, such as Ru, W or Mo. The metallic capping layer 22L comprises and/or consists essentially of a conductive metal nitride material such as TiN, TaN, WN, and/or MoN, or a transition metal (such as Ru or Co) that is different from the materials of the first and second metal layers 20L and 40L. For example, metallic capping layer 22L may comprise TiN if the first and second metal layers 20L and 40L comprise Ru. Alternatively, metallic capping layer 22L may comprise Ru or Co if the first and second metal layers 20L and 40L comprise W or Mo. The thickness of the metallic capping layer 22L as deposited over the first metal layer 20L is herein referred to as a first thickness t1.

Figures 4A, 4B, 4C:
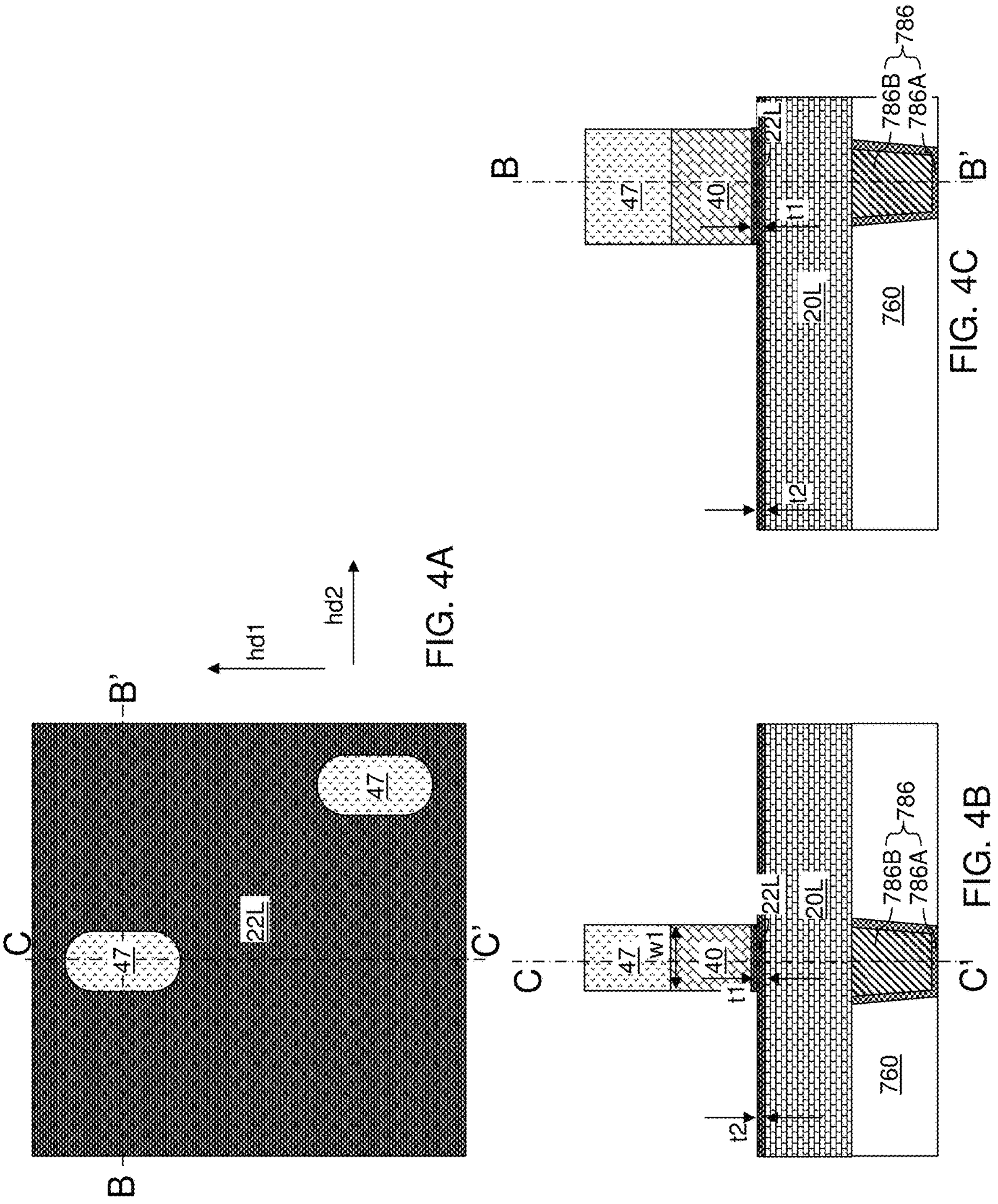
FIG. 4A is a top-down view of a portion of the exemplary structure after patterning the second metal layer into metal via structures according to an embodiment of the present disclosure.
FIG. 4B is a vertical cross-sectional view of the exemplary structure along the vertical plane B-B' of FIG. 4A.
FIG. 4C is a vertical cross-sectional view of the exemplary structure along the vertical plane C-C' of FIG. 4A.

Referring to FIGS. 4A-4C, a via-pattern etch mask 47 can be formed over the second metal layer 40L. In one embodiment, the via-pattern etch mask 47 may be formed by applying a first photoresist layer over the second metal layer 40L, and by lithographically patterning the first photoresist layer. In this case, the via-pattern etch mask 47 may comprise discrete photoresist material portions. Alternatively, a hard mask layer, such as a carbon hard mask layer, may be located under the first photoresist layer, and portions of the hard mask layer form lower portions of the mask 47.

In one embodiment, one, a plurality and/or each of the discrete portions of the via-pattern etch mask 47 may be elongated along a first horizontal direction hd1, and may have a width along a second horizontal direction hd2 that is perpendicular to the first horizontal direction hd1. In another embodiment, one, a plurality and/or each of the discrete portions of the via-pattern etch mask 47 may have a cylindrical shape having a circular horizontal cross-sectional shape. In yet another embodiment, one, a plurality and/or each of the discrete portions of the via-pattern etch mask 47 may have a respective shape of a rounded rectangle or an oval.

In one embodiment, one, a plurality and/or each of the discrete portions of the via-pattern etch mask 47 may have a respective width along the second horizontal direction hd2, which is herein referred to as a first width w1. The discrete portions of the via-pattern etch mask 47 may have the same width, or may have different widths. Generally, at least one of the discrete portions of the via-pattern etch mask 47 has the first width w1. In one embodiment, each of the discrete portions of the via-pattern etch mask 47 may have the first width w1. In one embodiment, the first width w1 may be a critical dimension of a lithographic tool that is employed to pattern the discrete portions of the via-pattern etch mask 47. As used herein, a "critical dimension" for a lithographic tool refers to the smallest dimension that may be printed employing a single lithographic exposure step and a single development step in the lithographic tool. In an illustrative example, the first width w1 may be in a range from 3 nm to 20 nm.

A first anisotropic etch process having a first etch chemistry can be performed to transfer the pattern in the discrete portions of the via-pattern etch mask 47 through the second metal layer 40L. According to an aspect of the present disclosure, the first etch chemistry of the first anisotropic etch process can be selected such that the first anisotropic etch process etches the second metal of the second metal layer 40L selective to the material of the metallic capping layer 22L. As used herein, an etch process etches a first material "selective to" a second material if the etch rate of the first material during the etch process is at least 3 times the etch rate of the second material during the etch process. Generally, a via-pattern etch mask including discrete portions of an etch mask material (such as a photoresist material) can be formed over the second metal layer 40L, and the pattern in the via-pattern etch mask 47 can be transferred through the second metal layer 40L by performing a first anisotropic etch process having a first etch chemistry that etches the second metal of the second metal layer 40L selective to the metallic capping material of the metallic capping layer 22L. For example, for a ruthenium second metal layer 40L, an oxygen and chlorine etch may be used. For a tungsten second metal layer 40L, a chlorine and $NF_3$ etch may be used. For a molybdenum second metal layer 40L, a halogen based gas (e.g., Cl, F or Br) etch may be used. Each remaining portion of the second metal layer 40L comprises a metal via structure 40.

Generally, each metal via structure 40 may have a same horizontal cross-sectional shape as a respective overlying portion of the via-pattern etch mask 47. In one embodiment, one, a plurality and/or each of the metallic via structures 40 may be elongated along the first horizontal direction hd1, and may have the first width w1 along the second horizontal direction hd2. In other embodiments, one, a plurality and/or each of the metallic via structures 40 may have a cylindrical shape having a circular horizontal cross-sectional shape or a shape of a rounded rectangle or an oval.

The selectivity of the first anisotropic etch process, i.e., the ratio of the etch rate of the second metal to the etch rate of the metallic capping material during the first anisotropic etch process, is finite, and thus, portions of the metallic capping layer 22L that are not masked by the via-pattern etch mask 47 may be collaterally etched and may have a second thickness t2 that is less than the first thickness t1. The ratio of the second thickness t2 to the first thickness may be in a range from 0.2 to 0.999, such as from 0.5 to 0.97, and/or from 0.7 to 0.9. In this case, each region of the metallic capping layer 22L that underlies a respective metal via structure 40 may have a greater thickness t1 than the thickness t2 of a region of the metallic capping layer 22L that is not covered by any metal via structure 40. The via-pattern etch mask 47 may be subsequently removed, for example, by ashing.

Figures 5A, 5B, 5C:
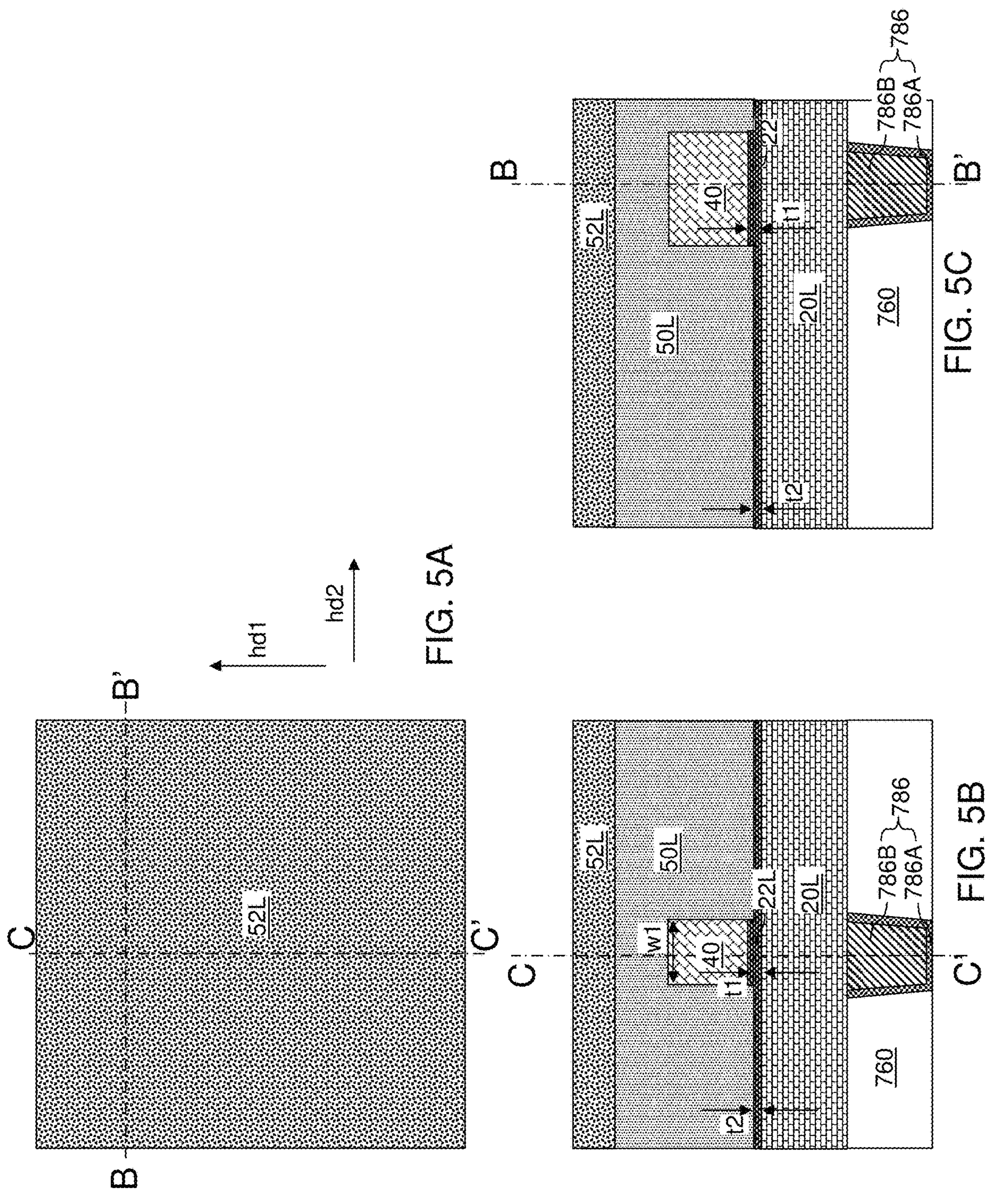
FIG. 5A is a top-down view of a portion of the exemplary structure after formation of an etch mask material layer according to an embodiment of the present disclosure.
FIG. 5B is a vertical cross-sectional view of the exemplary structure along the vertical plane B-B' of FIG. 5A.
FIG. 5C is a vertical cross-sectional view of the exemplary structure along the vertical plane C-C' of FIG. 5A.

Referring to FIGS. 5A-5C, a mask layer 50L and an optional hard mask layer 52L may be formed over the metallic capping layer 22L and the metallic via structures 40. The mask layer 50L can comprise a dielectric material such as silicon nitride, silicon oxycarbide, silicon oxynitride, silicon oxide, or a combination thereof. The mask layer 50L may be deposited by chemical vapor deposition. Optionally, the top surface of the mask layer 50L may be planarized, for example, by performing a chemical mechanical polishing process. The optional hard mask layer 52L, if present, may comprise, for example, amorphous carbon or diamond-like carbon (DLC). For example, the hard mask layer 52L may be added if the mask layer 50L comprises silicon nitride and the metal via structure 40 comprises tungsten.

Figures 6A, 6B, 6C:
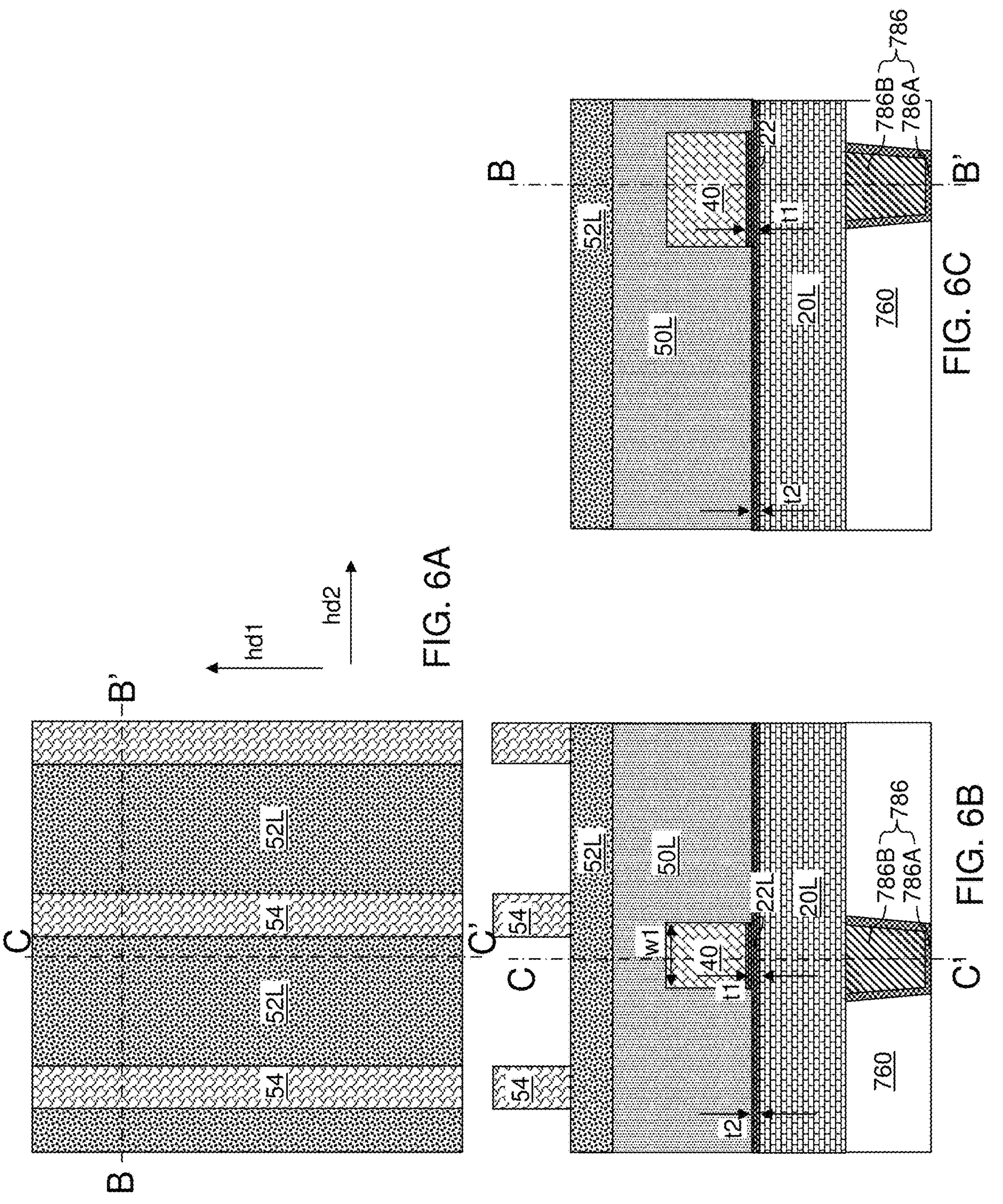
FIG. 6A is a top-down view of a portion of the exemplary structure after formation of sacrificial line templates according to an embodiment of the present disclosure.
FIG. 6B is a vertical cross-sectional view of the exemplary structure along the vertical plane B-B' of FIG. 6A.
FIG. 6C is a vertical cross-sectional view of the exemplary structure along the vertical plane C-C' of FIG. 6A.

Referring to FIGS. 6A-6C, a sacrificial material layer can be deposited over the optional hard mask layer 52L, and can be lithographically patterned to form a one-dimensional array of line-and-space patterns (i.e., rails) having a uniform pitch. Each discrete patterned portion of the sacrificial material layer has a line (i.e., rail) shape laterally extending along the first horizontal direction hd1 and having a uniform width along the second horizontal direction hd2, and is subsequently employed as a template for forming line-shaped spacer structures. As such, each discrete patterned portion of the sacrificial material layer is herein referred to as a sacrificial line template 54.

The sacrificial material layer, and thus, the sacrificial line templates 54, can comprise a material that is different from the material of the hard mask layer 52L. In one embodiment, the sacrificial material layer, and thus, the sacrificial line templates 54, may comprise and/or may consist essentially of a metal or a semiconductor material such as amorphous silicon, polysilicon, or a silicon-germanium alloy. The ratio of the width of each sacrificial line template 54 to the pitch of the one-dimensional array of sacrificial line templates 54 along the second horizontal direction hd2 may be in a range from 0.15 to 0.35, such as from 0.20 to 0.30, and/or from 0.225 to 0.275, although lesser and greater ratios may also be employed. The width of each sacrificial line template 54 along the second horizontal direction hd2 may be on the order of the first width w1.

Figure 7A:
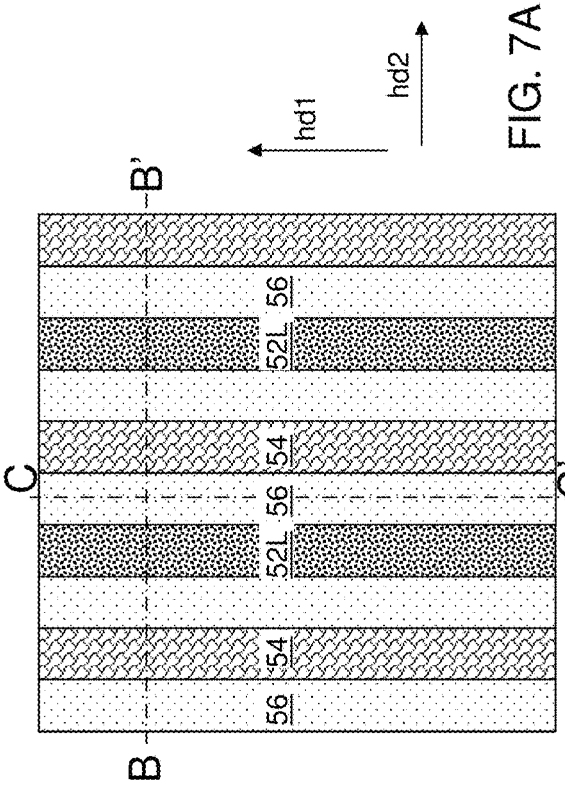
FIG. 7A is a top-down view of a portion of the exemplary structure after formation of etchmask linear spacers according to an embodiment of the present disclosure.
Figure 7B:
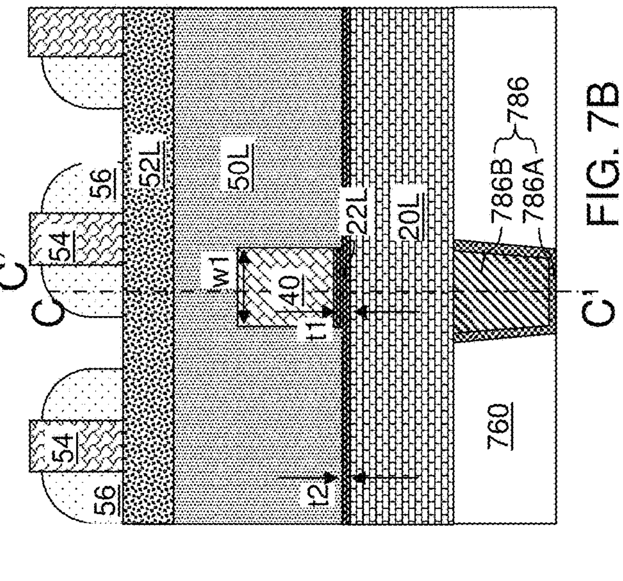
FIG. 7B is a vertical cross-sectional view of the exemplary structure along the vertical plane B-B' of FIG. 7A.
Figure 7C:
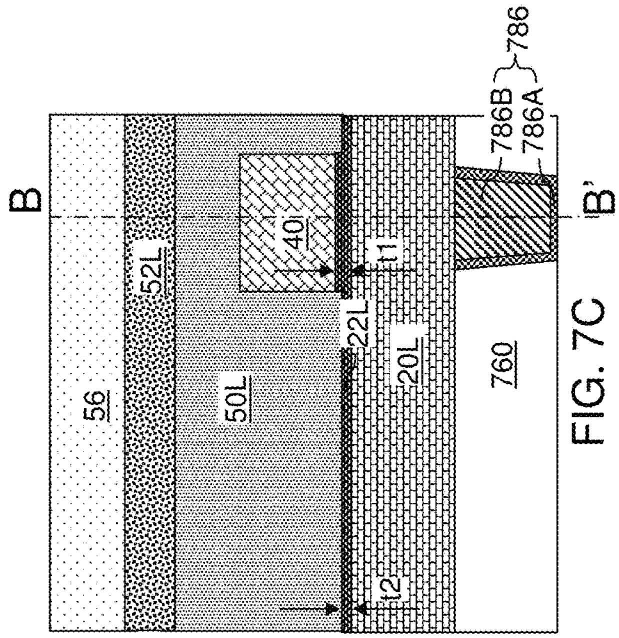
FIG. 7C is a vertical cross-sectional view of the exemplary structure along the vertical plane C-C' of FIG. 7A.

Referring to FIGS. 7A-7C, a conformal material layer can be deposited over the one-dimensional array of sacrificial line templates 54 by a conformal deposition process, such as a chemical vapor deposition. The conformal material layer comprises a material that can be etched selective to the materials of the sacrificial line templates 54 and the hard mask layer 52L. In one embodiment, the conformal material layer comprises a dielectric material, such as silicon oxide. In an illustrative example, the mask layer 50L comprises silicon nitride, the hard mask layer 52L comprises a carbon-based material, and the sacrificial line layer comprises silicon oxide.

An anisotropic sidewall spacer etch process can be performed to remove horizontally-extending portions of the conformal material layer. Each remaining portion of the conformal material layer constitutes an etchmask linear spacer 56. A one-dimensional array of etchmask linear spacers 56 can be formed over the mask layer 50L (and the hard mask layer 52L, if present). The pitch of the one-dimensional array of etchmask linear spacers 56 may be one half of the pitch of the sacrificial line templates 54. Each etchmask linear spacer 56 laterally extends along the first horizontal direction hd1, and has a width along the second horizontal direction hd2. Each sacrificial line template 54 may be contacted by a respective pair of etchmask linear spacers 56.

Figure 8A:
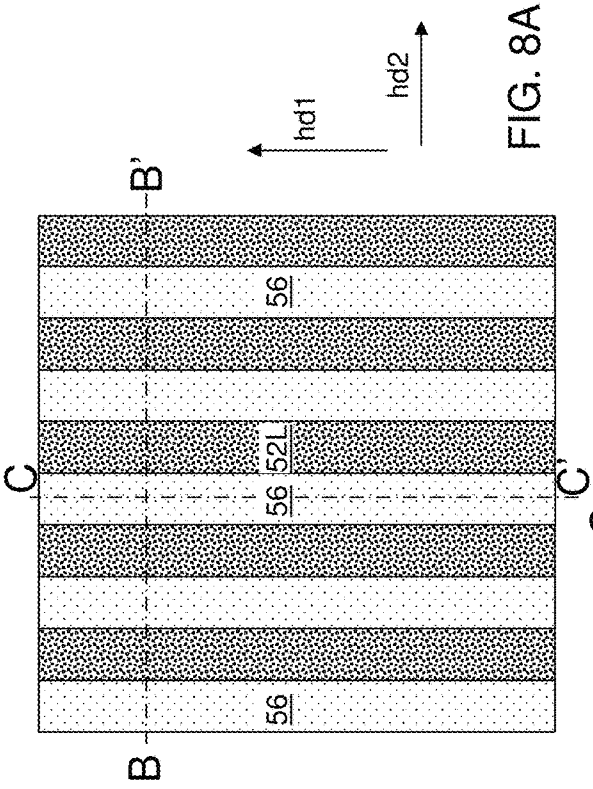
FIG. 8A is a top-down view of a portion of the exemplary structure after removal of the sacrificial line templates according to an embodiment of the present disclosure.
Figure 8B:
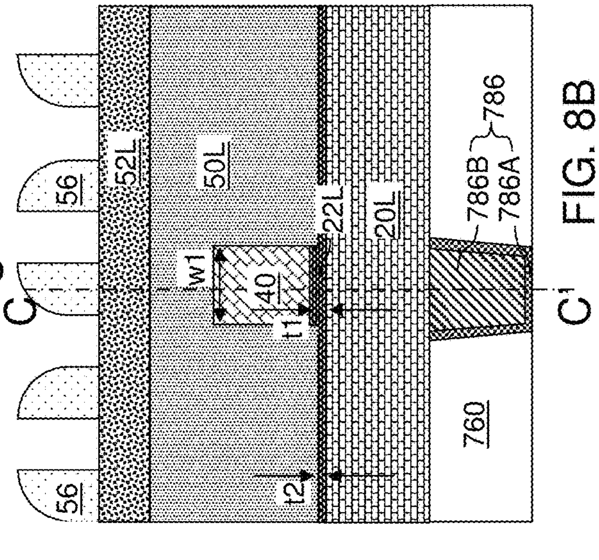
FIG. 8B is a vertical cross-sectional view of the exemplary structure along the vertical plane B-B' of FIG. 8A.
Figure 8C:
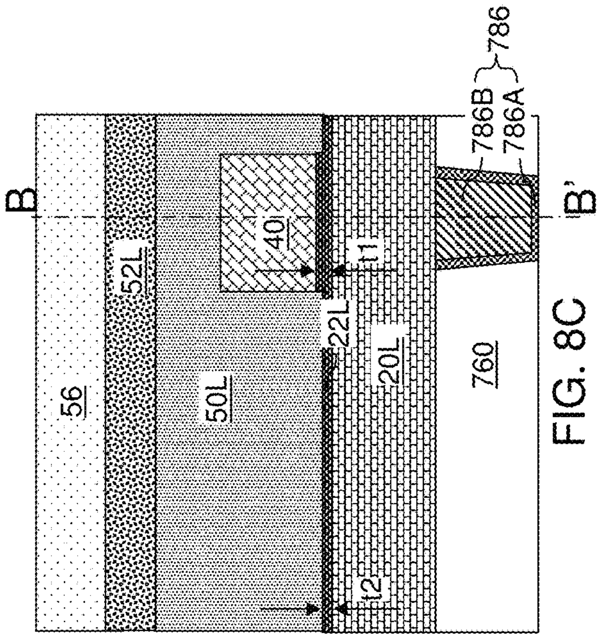
FIG. 8C is a vertical cross-sectional view of the exemplary structure along the vertical plane C-C' of FIG. 8A.

Referring to FIGS. 8A-8C, the sacrificial line templates 54 may be removed selective to the etchmask linear spacers 56 and the mask layer 50L or the hard mask layer 52L (if present). In an illustrative example, if the sacrificial line templates 54 comprise amorphous silicon or polysilicon and if the etchmask linear spacers 56 comprise silicon oxide, a wet etch process using hot trimethyl-2 hydroxyethyl ammonium hydroxide ("hot TMY") or tetramethyl ammonium hydroxide (TMAH) may be used to remove the sacrificial line templates 54 selective to the etchmask linear spacers 56 and the hard mask layer 52L.

Figures 9A, 9B, 9C:
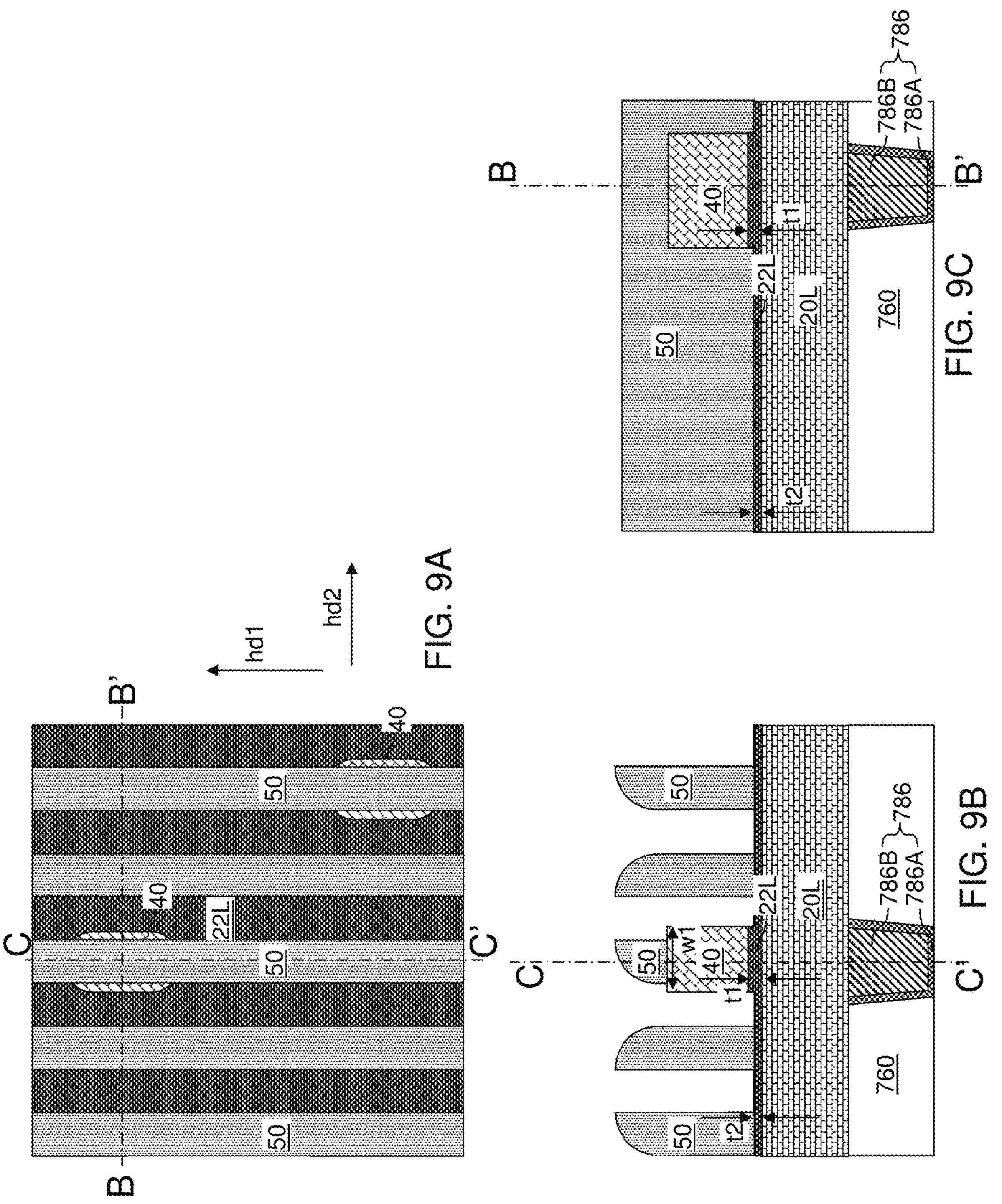
FIG. 9A is a top-down view of a portion of the exemplary structure after formation of linear etch mask structures according to an embodiment of the present disclosure.
FIG. 9B is a vertical cross-sectional view of the exemplary structure along the vertical plane B-B' of FIG. 9A.
FIG. 9C is a vertical cross-sectional view of the exemplary structure along the vertical plane C-C' of FIG. 9A.

Referring to FIGS. 9A-9C, an anisotropic etch process can be performed to transfer the pattern in the etchmask linear spacers 56 through the optional hard mask layer 52L and the mask layer 50L. Portions of the optional hard mask layer 52L and the mask layer 50L that are not masked by the etchmask linear spacers 56 can be etched through during the anisotropic etch process. The etchmask linear spacers 56 and any remaining portion of the optional hard mask layer 52L may be collaterally consumed during the anisotropic etch process. Remaining portions of the mask layer 50L comprise a line-and-space-pattern etch mask 50, i.e., an etch mask having a line-and-space pattern. A "line-and-space pattern" refers to a pattern in which a unit pattern is repeated with a periodicity and the unit pattern includes a line having a first uniform width and an adjoining space having a second uniform width. The chemistry of the anisotropic etch process can be selected to etch the material of the mask layer 50L. In an illustrative example, if the mask layer 50L comprises silicon nitride, then a combination of at least one fluoro-hydrocarbon gas (such as $CH_2F_2$ and/or $CHF_3$) and oxygen may be used to etch the unmasked portions of the mask layer 50L.

Figure 9D:
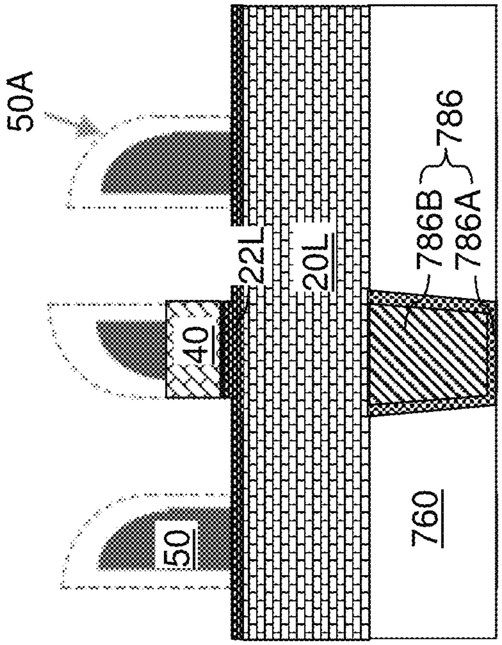
FIG. 9D is a vertical cross-sectional view of an alternative configuration of the exemplary structure along the vertical plane B-B' of FIG. 9A.

In one embodiment shown in FIG. 9D, after removing the unmasked portions of the mask layer 50L to form an initial line-and-space-pattern etch mask 50A and to expose an underlying layer (e.g., the metallic capping layer 22L), the etch may be continued to slim (i.e., narrow) the width of the initial line-and-space-pattern etch mask 50A. In an illustrative example, if the initial line-and-space-pattern etch mask 50A comprises silicon nitride, then the slimming etch may comprise a combination of at least one fluoro-hydrocarbon gas (such as $CH_2F_2$ and/or $CHF_3$) and oxygen to narrow the width of the initial line-and-space-pattern etch mask 50A to form the line-and-space-pattern etch mask 50. If any portion of the initial line-and-space-pattern etch mask 50A is misaligned with the underlying metal via structure 40 and extends over a sidewall of the metal via structure 40 to contact the metallic capping layer 22L, then the slimming etch may remove such misaligned portion of the initial line-and-space-pattern etch mask 50A. Therefore, the slimmed line-and-space-pattern etch mask 50 may be located only on the top surface of the metal via structure 40.

According to an aspect of the present disclosure, the locations of the metal via structures 40 can be selected such that each of the metal via structures 40 underlies a respective portion of the line-and-space-pattern etch mask 50. In one embodiment, the width of each line-and-space-pattern etch mask 50 along the second horizontal direction hd2 may be less than the first width w1. The anisotropic etch process and the optional slimming etch that pattern the hard mask layer 50L into the line-and-space-pattern etch mask 50 may be selective to the metallic capping material of the metallic capping layer 22L, and may be selective to the second metal of the metal via structures 40, such that the metallic capping layer 22L acts as an etch stop during the anisotropic etch and the optional slimming etch.

Generally, the line-and-space-pattern etch mask 50 can be formed over the metal via structures 40 and the metallic capping layer 22L. The line-and-space-pattern etch mask 50 can have a periodic line-and-space pattern in which patterned etch mask material portions laterally extend along the first horizontal direction hd1 and are laterally arranged with a uniform pitch along the second horizontal direction hd2, which is perpendicular to the first horizontal direction hd1. In one embodiment, the width of each patterned etch mask material portion along the second horizontal direction hd2 may be less than the width of a metal via structure 40 along the second horizontal direction hd2, i.e., the first width w1. In this case, peripheral portions of a top surface of a metal via structure 40 may be physically exposed.

Figure 10A:
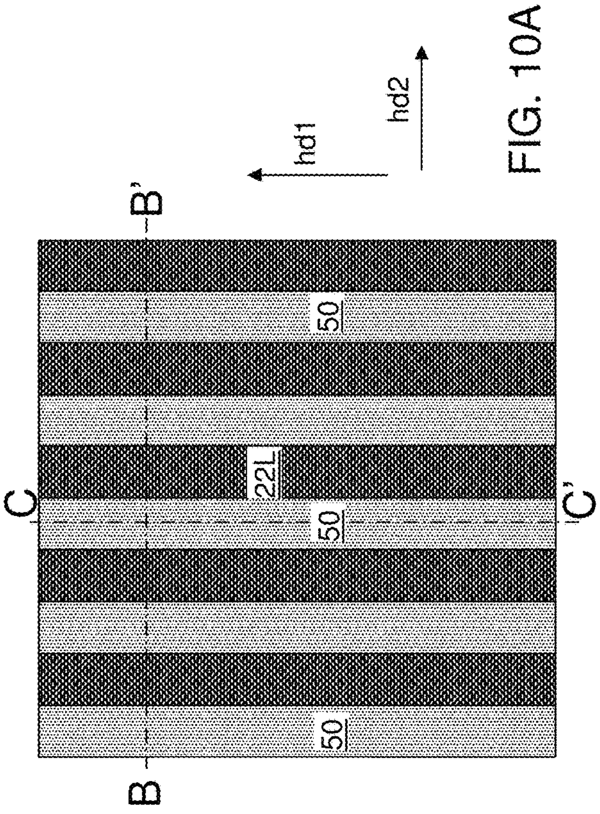
FIG. 10A is a top-down view of a portion of the exemplary structure after etching unmasked portions of the metal via structures according to an embodiment of the present disclosure.
Figure 10B:
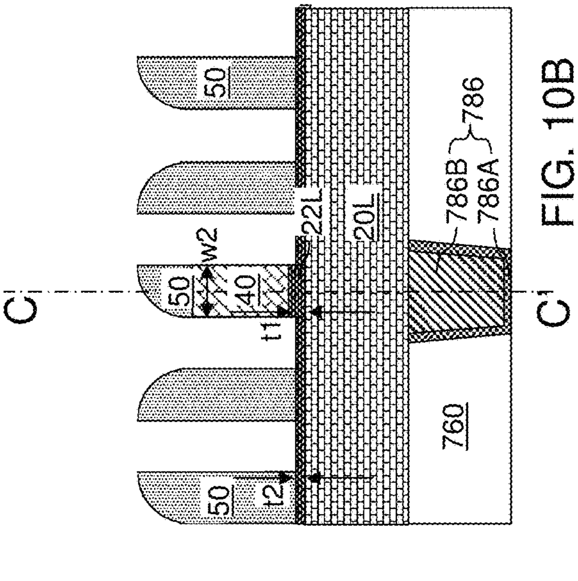
FIG. 10B is a vertical cross-sectional view of the exemplary structure along the vertical plane B-B' of FIG. 10A.
Figure 10C:
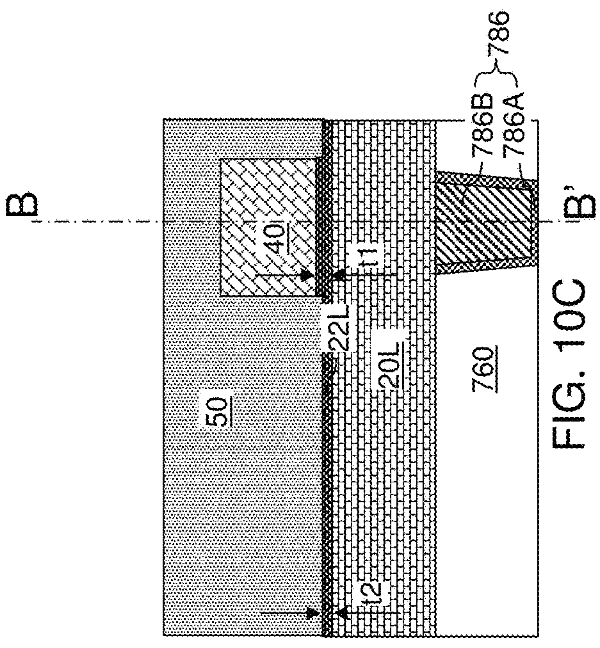
FIG. 10C is a vertical cross-sectional view of the exemplary structure along the vertical plane C-C' of FIG. 10A.

Referring to FIGS. 10A-10C, a second anisotropic etch process can be performed to transfer the pattern in the line-and-space-pattern etch mask 50 through the metal via structures 40, the metallic capping layer 22L, and the first metal layer 20L. The line-and-space-pattern etch mask 50 can be employed as an etch mask for the second anisotropic etch process. In one embodiment, the second anisotropic etch process comprises a first etch step that etches the second metal of the metal via structures 40 selective to the metallic capping material of the metallic capping layer 22L, such that the metallic capping layer 22L acts as an etch stop. The etch chemistry of the first etch stop of the second anisotropic etch process can be selected depending on the material compositions of the metal via structures 40 and the metallic capping layer 22L. In an illustrative example, if the metal via structures 40 comprise ruthenium and if the metallic capping layer 22L comprises titanium nitride, then the first etch step of the second anisotropic etch process may employ a combination of $Cl_2$ and $O_2$ as an etchant gas. If the metal via structures 40 comprise tungsten and if the metallic capping layer 22L comprises ruthenium or cobalt, then the first etch step of the second anisotropic etch process may employ a combination of $NF_3$ and $Cl_2$ as an etchant gas. If the metal via structures 40 comprise molybdenum and if the metallic capping layer 22L comprises ruthenium or cobalt, then the first etch step of the second anisotropic etch process may employ a halogen gas as an etchant gas. In one embodiment, each of the metal via structures 40 may have a uniform width along the second horizontal direction hd2 that is the same as the width of a respective overlying hard mask material portion of the line-and-space-pattern etch mask 50. In one embodiment, each of the metal via structures 40 may have a second width w2, which is less than the first width w1, and may be the same as the width of a respective overlying portion of the line-and-spacer-pattern etch mask 50.

Figures 12A, 12B, 12C:
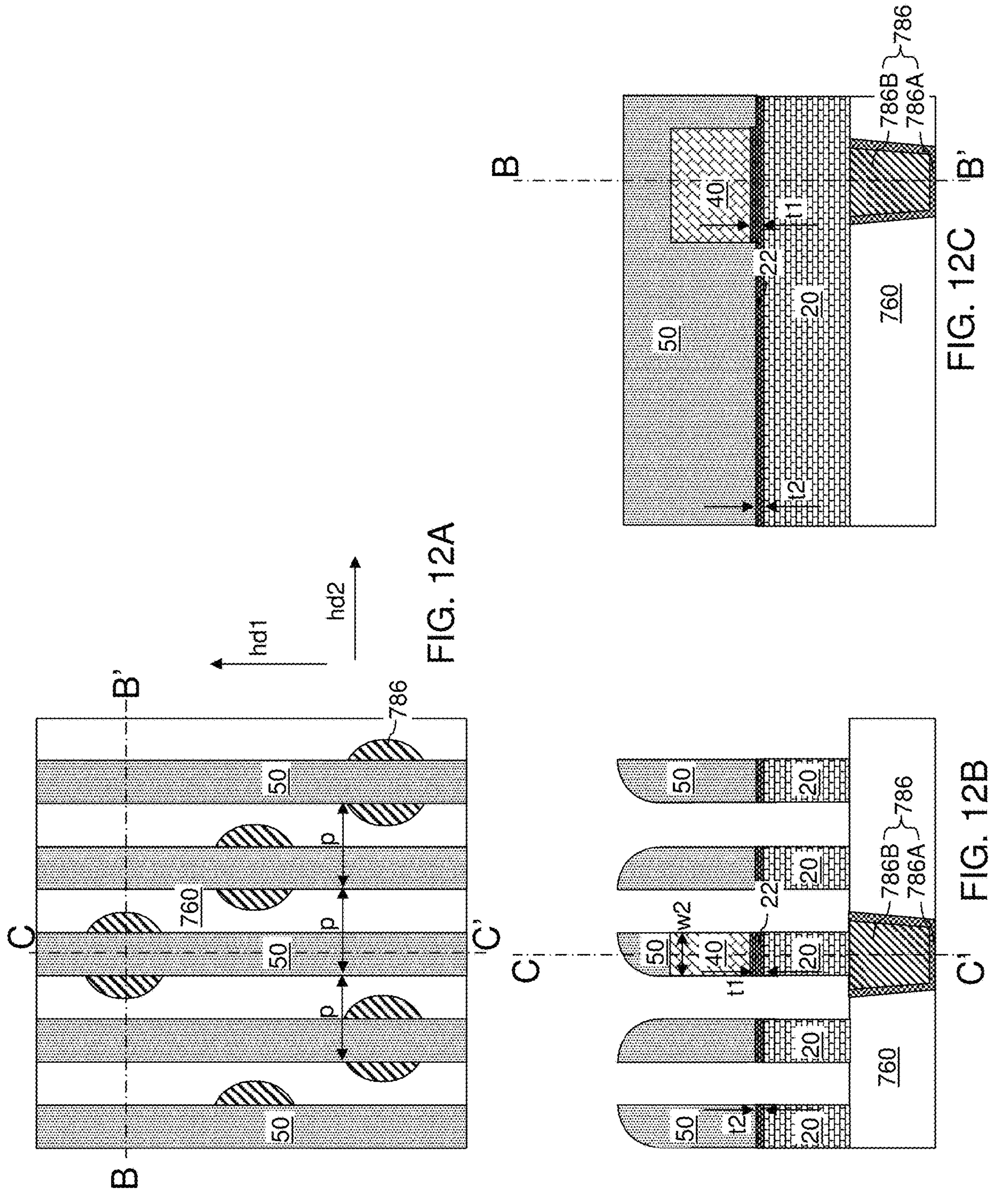
FIG. 12A is a top-down view of a portion of the exemplary structure after formation of metal line structures according to an embodiment of the present disclosure.
FIG. 12B is a vertical cross-sectional view of the exemplary structure along the vertical plane B-B' of FIG. 12A.
FIG. 12C is a vertical cross-sectional view of the exemplary structure along the vertical plane C-C' of FIG. 12A.

Referring to FIGS. 12A-12C, the second anisotropic etch process may comprise a second etch step that etches unmasked portions the metallic capping material of the metallic capping layer 22L. Each patterned portion of the metallic capping layer 22L constitutes a metallic capping plate 22 having the second width w2 along the second horizontal direction hd2. A one-dimensional periodic array of metallic capping plates 22 may be formed. If the metallic capping layer 22L comprises titanium nitride, then a combination of $NF_3$ and chlorine or $CF_4$ and oxygen may be used as plasma etchant gas. If the metallic capping layer 22L comprises ruthenium, then a combination of $Cl_2$ and $O_2$ may be used as an etchant gas. If the metallic capping layer 22L comprises cobalt, then either a wet etch or a chemical dry etch may be used. In a wet etch, the cobalt may be oxidized to form a cobalt oxide surface layer, which is then removed using an acid. In a chemical dry etch, the cobalt may be chlorinated to firm cobalt chloride, which is then reacted with a oxyfluorocarbon etching compound (e.g., hexafluoroacetylacetone) to form an organic cobalt chloride compound (e.g., cobalt) hexafluoroacetylacetonate chloride) which is sublimated away by heating.

Figure 11A:
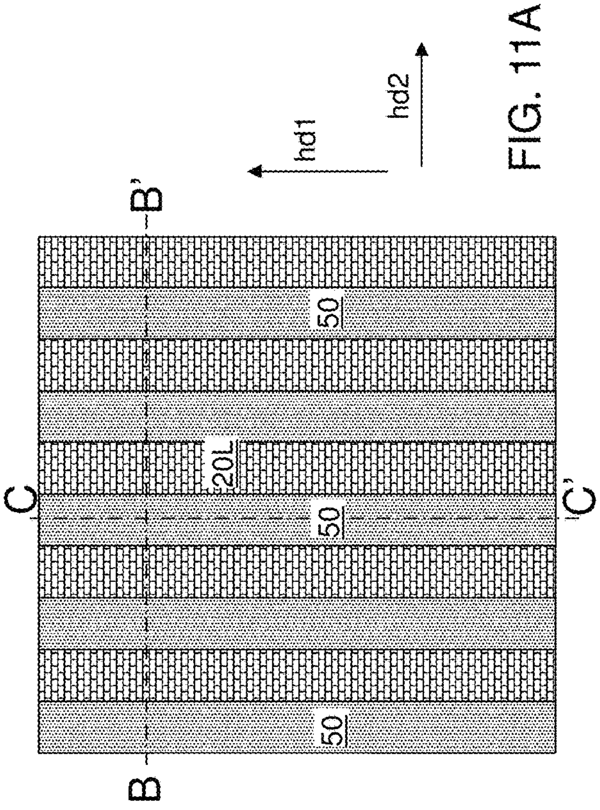
FIG. 11A is a top-down view of a portion of the exemplary structure during transfer of a pattern in the linear etch mask structures into the first metal layer according to an embodiment of the present disclosure.
Figure 11B:
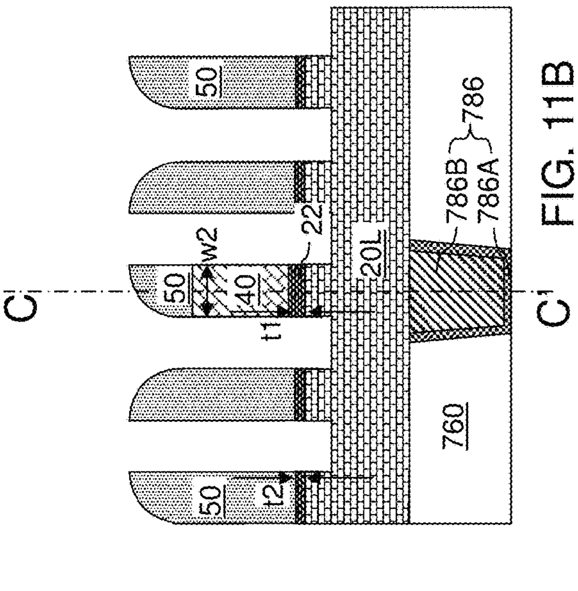
FIG. 11B is a vertical cross-sectional view of the exemplary structure along the vertical plane B-B' of FIG. 11A.
Figure 11C:
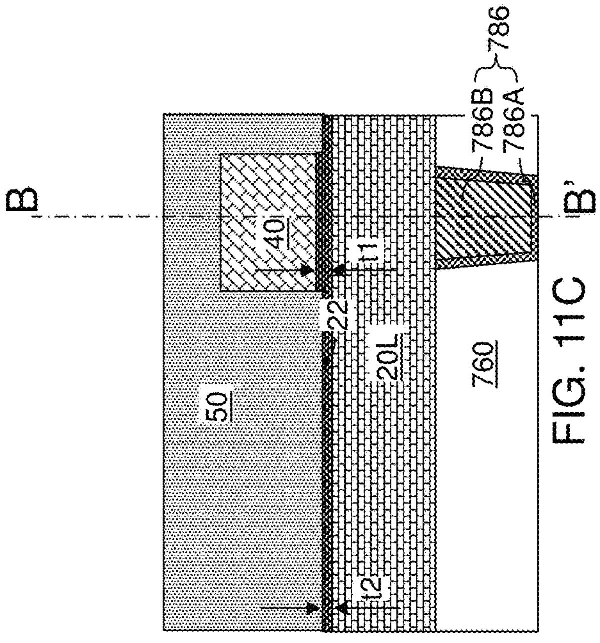
FIG. 11C is a vertical cross-sectional view of the exemplary structure along the vertical plane C-C' of FIG. 11A.

The second anisotropic etch process may comprise a third etch step that etches unmasked portions of the first metal layer 20L. The etch chemistry of the third etch step may be selected based on the first metal of the first metal layer 20L. For example, if the first metal layer 20L comprises ruthenium, then the third etch step of the second anisotropic etch process may employ a combination of $Cl_2$ and $O_2$ as an etchant gas. If the first metal layer 20L comprises tungsten, then the third etch step of the second anisotropic etch process may employ a combination of $NF_3$ and $Cl_2$ as an etchant gas. If the first metal layer 20L comprises molybdenum, then the third etch step of the second anisotropic etch process may employ a halogen gas as an etchant gas. FIGS. 11A-11C illustrate the exemplary structure during the third etch step of the second anisotropic etch process.

Referring to FIGS. 12A-12C, the third etch step of the second anisotropic etch process can be continued until the first metal layer 20L is etched through. Remaining portions of the first metal layer 20L may comprise a one-dimensional array of metal line structures 20. Each of the metal line structures 20 may have the second width w2. The third etch step of the second anisotropic etch process may be selective to the dielectric material of the via-level dielectric material layer in the lower-level dielectric material layers 760.

Each contiguous combination of a metal line structure 20, a metallic capping plate 22, and at least one metal via structure 40 (which may be a plurality of metal via structures 40 or a single metal via structure 40) constitutes an integrated line-and-via structure (20, 22, 40). Each integrated line-and-via structure (20, 22, 40) comprises a metal line structure 20 comprising a first metal and having a pair of lengthwise metal line sidewalls that laterally extend along a first horizontal direction hd1; a metallic capping plate 22 comprising a metallic capping material and overlying the metal line structure 20 and having a pair of lengthwise metal cap sidewalls that are vertically coincident with the pair of lengthwise metal line sidewalls; and a metal via structure 40 comprising a second metal and having a pair of lengthwise metal via sidewalls that is vertically coincident with the pair of lengthwise metal cap sidewalls and having a lateral extend along the first horizontal direction hd1 that is less than a lateral extent of the metal line structure 20 along the first horizontal direction hd1. In one embodiment, an entirety of the pair of lengthwise metal via sidewalls and an entirety of the pair of lengthwise metal line sidewalls are located within a pair of vertical planes that laterally extends along the first horizontal direction hd1.

In one embodiment, the metallic capping plate 22 has a first thickness t1 in a first area that underlies the metal via structure 40 and has a second thickness t2 in a second area that does not have an areal overlap with the metal via structure 40. The second thickness t2 can be less than the first thickness t1.

In one embodiment, a one-dimensional periodic array of metal line structures 20 can be formed. Each of the metal line structures 20 may have a respective pair of lengthwise metal line sidewalls that laterally extend along the first horizontal direction hd1. The metal line structures 20 among the one-dimensional periodic array of metal line structures 20 may be arranged with a periodic pitch along a second horizontal direction hd2 that is perpendicular to the first horizontal direction hd1.

In one embodiment, each of the metallic via structures 40, the metallic capping plates 22, and the metal line structures 20 may have a second width w2 after the second anisotropic etch process. The second width w2 is less than the first width w1. A top surface of an underlying dielectric material layer 760 may be physically exposed between the metal line structures 20. In one embodiment, an underlying metal via structure 786 (or an underlying metal line structure 784) may be embedded within the underlying dielectric material layer 760. Each of the underlying metal via structures 786 may comprise a metallic via liner 786A contacting a sidewall of the underlying dielectric material layer 760 and a metallic via fill material portion 786B that is laterally surrounded by the metallic via liner 786A. In one embodiment, one, a plurality and/or each of the metal line structures 20 may comprise a respective bottom surface that contacts a top surface of a respective metallic via liner 786A and a top surface of a respective metallic via fill material portion 786B.

Figure 13A:
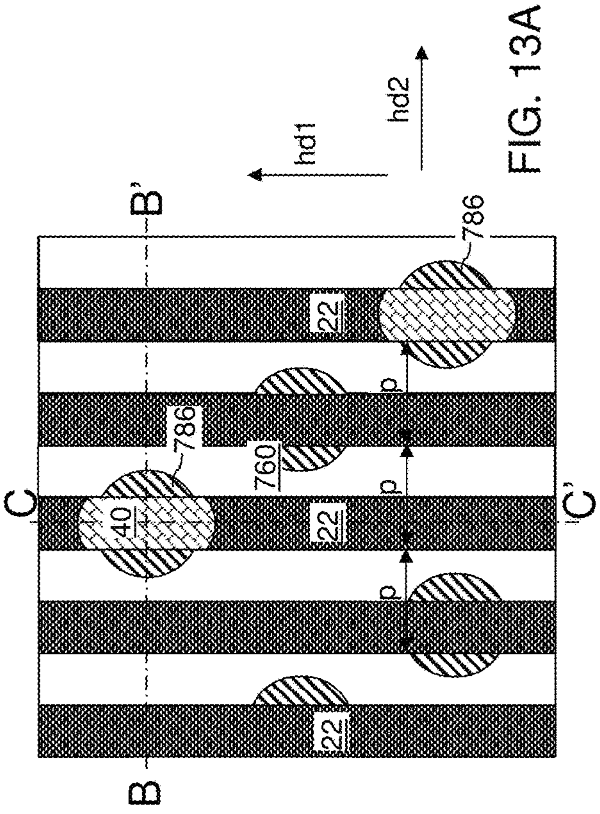
FIG. 13A is a top-down view of a portion of the exemplary structure after removal of the linear etch mask structures according to an embodiment of the present disclosure.
Figure 13B:
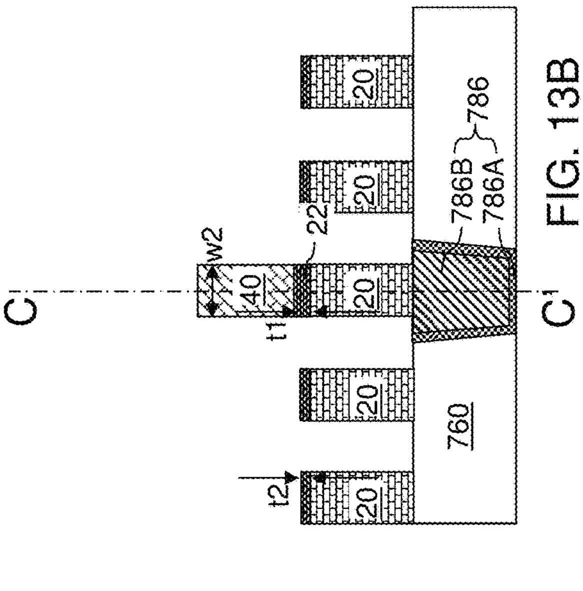
FIG. 13B is a vertical cross-sectional view of the exemplary structure along the vertical plane B-B' of FIG. 13A.
Figure 13C:
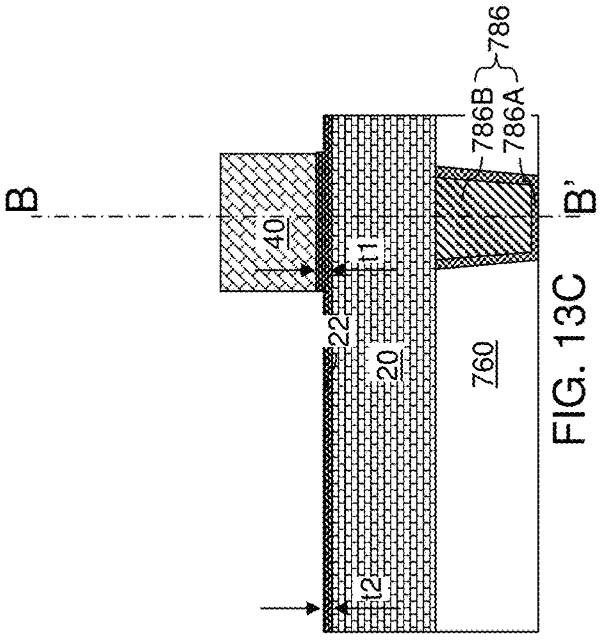
FIG. 13C is a vertical cross-sectional view of the exemplary structure along the vertical plane C-C' of FIG. 13A.

Referring to FIGS. 13A-13C, the line-and-space-pattern etch mask 50 may be removed selective to the materials of the integrated line-and-via structures (20, 22, 40), the underlying metal via structures 786, and the underlying dielectric material layers 760. For example, if the line-and-space-pattern etch mask 50 comprises silicon nitride, a wet etch process employing hot phosphoric acid may be performed to remove the line-and-space-pattern etch mask 50.

Figures 14A, 14B, 14C:
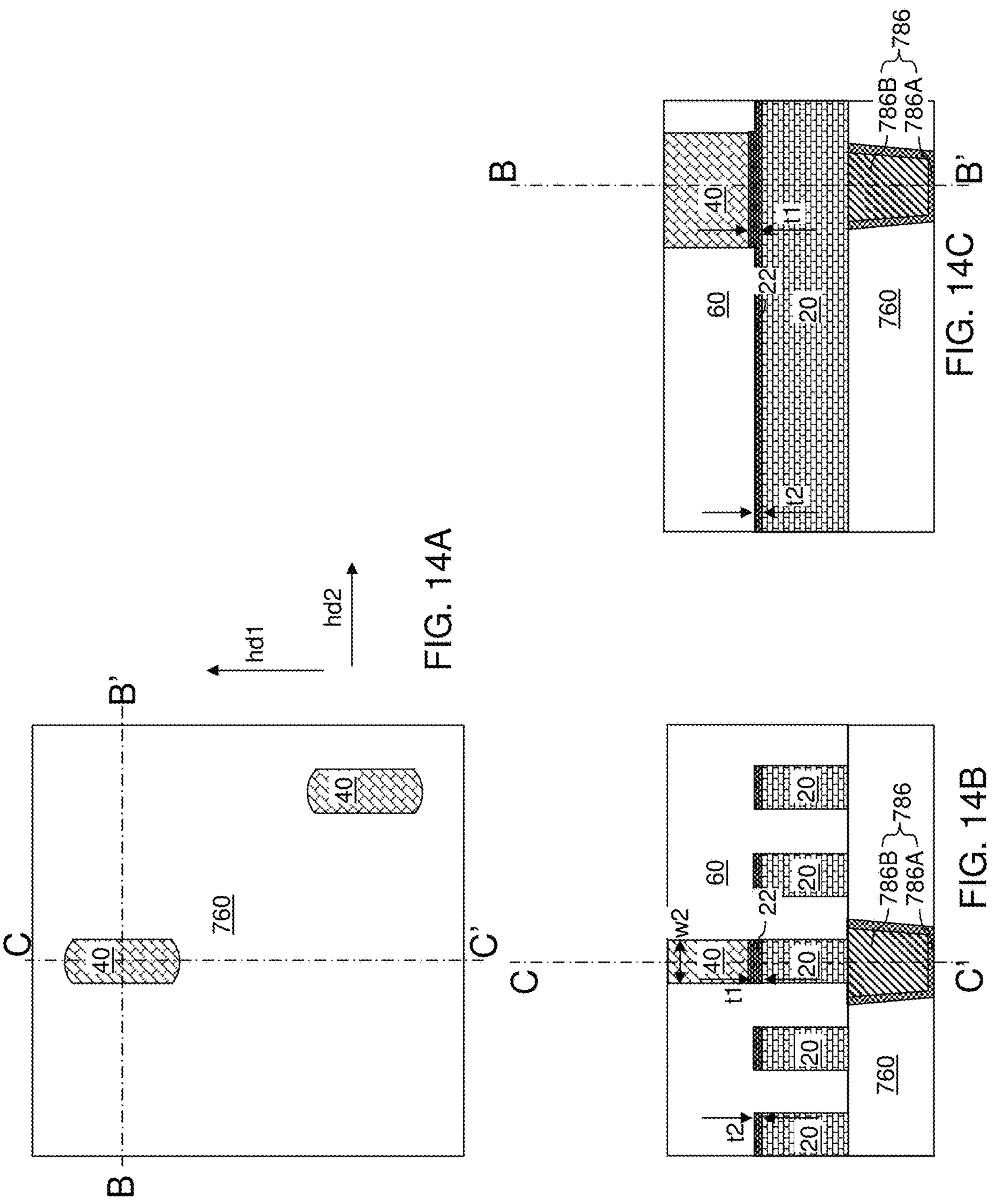
FIG. 14A is a top-down view of a portion of the exemplary structure after deposition and planarization of a dielectric material layer according to an embodiment of the present disclosure.
FIG. 14B is a vertical cross-sectional view of the exemplary structure along the vertical plane B-B' of FIG. 14A.
FIG. 14C is a vertical cross-sectional view of the exemplary structure along the vertical plane C-C' of FIG. 14A.

Referring to FIGS. 14A-14C, a dielectric material, such as undoped silicate glass, a doped silicate glass, or organosilicate glass can be deposited over the integrated line-and-via structures (20, 22, 40). A planarization process such as a chemical mechanical polishing process can be performed to remove portions of the deposited dielectric material that overlie the horizontal plane including the top surfaces of the metal via structures 40. Remaining portions of the deposited dielectric material constitutes a dielectric material layer 60, which is also referred to as a first line-and-via-level dielectric material layer. In one embodiment, the dielectric material layer 60 may have a homogeneous material composition throughout. In one embodiment, the dielectric material layer 60 may have a bottom surface with a horizontal plane including the bottom surfaces of the metal line structures 20, and may have a top surface within a horizontal plane including top surfaces of the metal via structures 40. The dielectric material layer 60 is formed over, and directly on, the metallic capping plates 22. As such, a top surface of each metallic capping plate 22 may be in contact with a respective horizontal surface of the dielectric material layer 60. For each integrated line-and-via structure (20, 22, 40), the entirety of the pair of lengthwise metal line sidewalls, the pair of lengthwise metal cap sidewalls, and the pair of lengthwise metal via sidewalls may be in contact with the dielectric material layer 60.

Figure 14D:
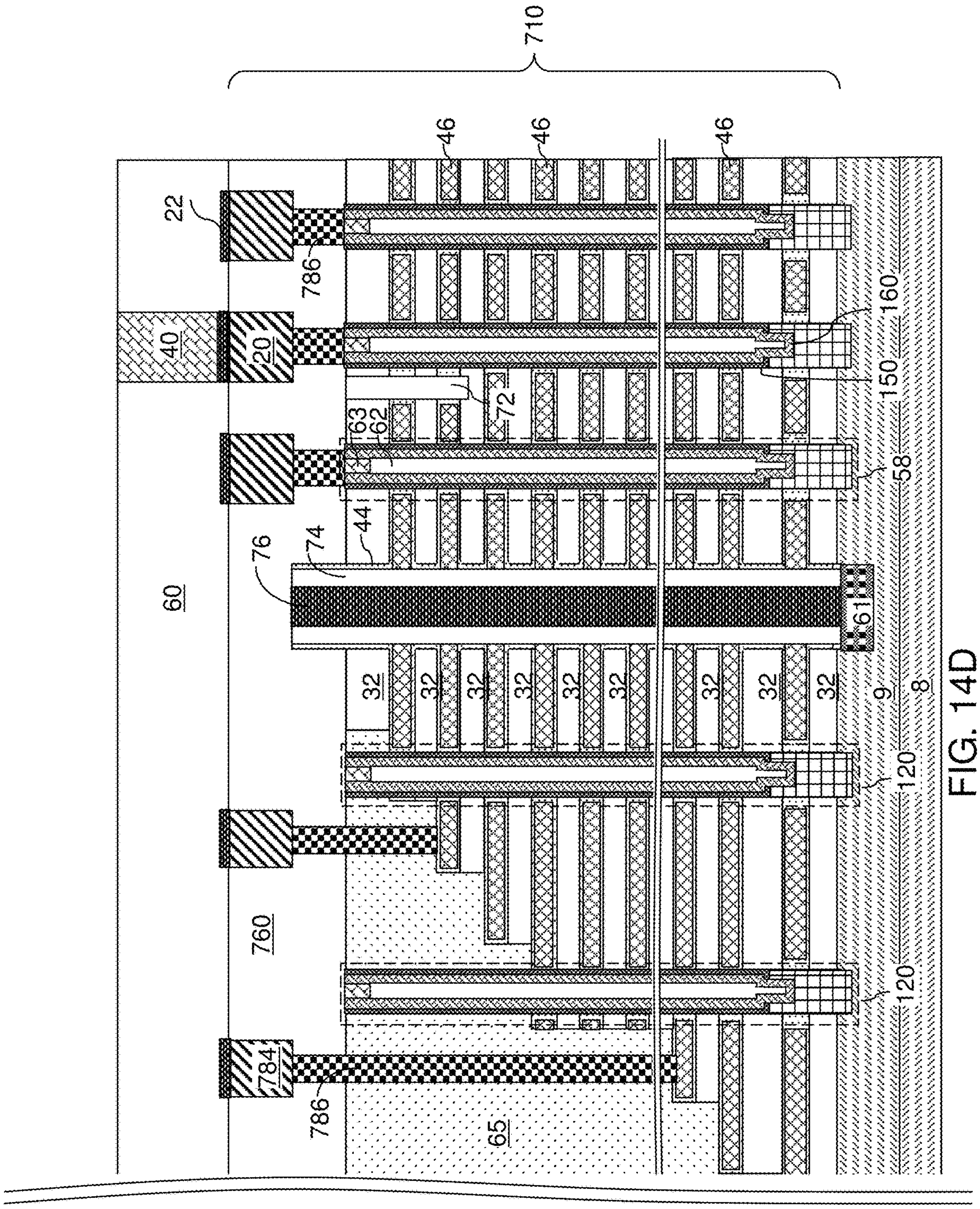
FIG. 14D is a vertical cross-sectional view of the exemplary structure of FIG. 14A located in a memory device of FIG. 1B.

In one embodiment, the integrated line-and-via structure may comprise a bit line interconnect structure for the three-dimensional memory device of FIG. 1B. For example, the metal line structures 20 may comprise the bit lines 784 shown in FIG. 1B while the metal via structures 40 may comprise bit line contact vias of a bit line interconnect metallization, as shown in FIG. 14D.

Figures 15A, 15B, 15C:
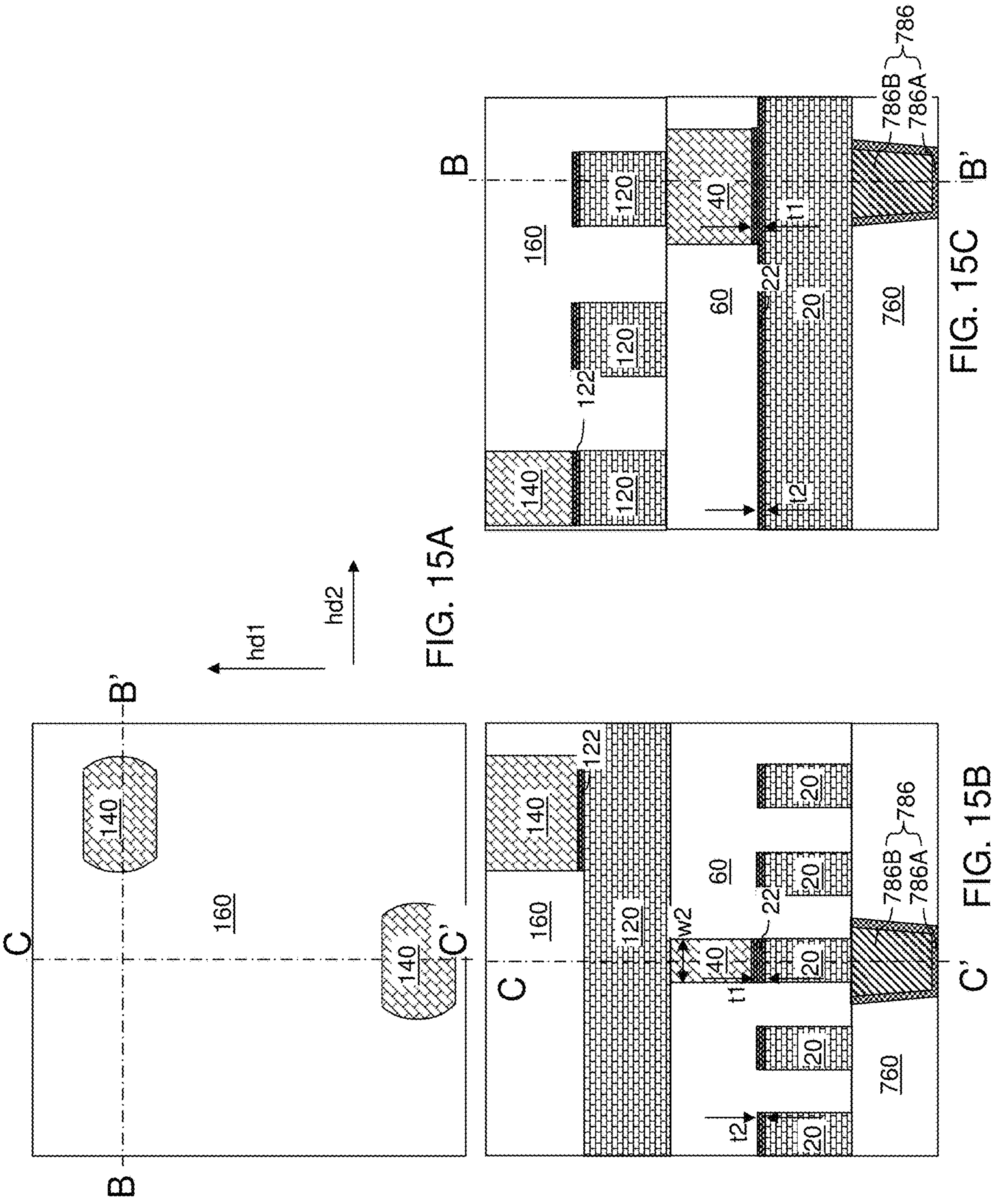
FIG. 15A is a top-down view of a portion of the exemplary structure after formation of upper-level line-and-via structures and an additional dielectric material layer according to an embodiment of the present disclosure.
FIG. 15B is a vertical cross-sectional view of the exemplary structure along the vertical plane B-B' of FIG. 15A.
FIG. 15C is a vertical cross-sectional view of the exemplary structure along the vertical plane C-C' of FIG. 15A.

Referring to FIGS. 15A-15C, the processing steps described with reference to FIGS. 3A-14C may be optionally repeated with any needed changes at least once to form additional integrated line-and-via structures (120, 122, 140) (which are herein referred to as upper-level line-and-via structures) and at least one additional dielectric material layer 160 (which is herein referred to as at least one additional line-and-via-level dielectric material layer). Each additional integrated line-and-via structure (120, 122, 140) may comprise a respective metal line structure 120 comprising a respective first metal and having a respective pair of lengthwise metal line sidewalls that laterally extend along a respective horizontal direction; a respective metallic capping plate 122 comprising a respective metallic capping material and overlying the respective metal line structure 120 and having a respective pair of lengthwise metal cap sidewalls that are vertically coincident with the respective pair of lengthwise metal line sidewalls; and a respective metal via structure 140 comprising a respective second metal and having a respective pair of lengthwise metal via sidewalls that is vertically coincident with the respective pair of lengthwise metal cap sidewalls and having a lateral extend along the respective horizontal direction that is less than a lateral extent of the respective metal line structure 120 along the respective horizontal direction. Subsequently, additional metal interconnect structures and/or metal bonding pads and/or additional dielectric material layers may be formed as needed.

Figure 16A:
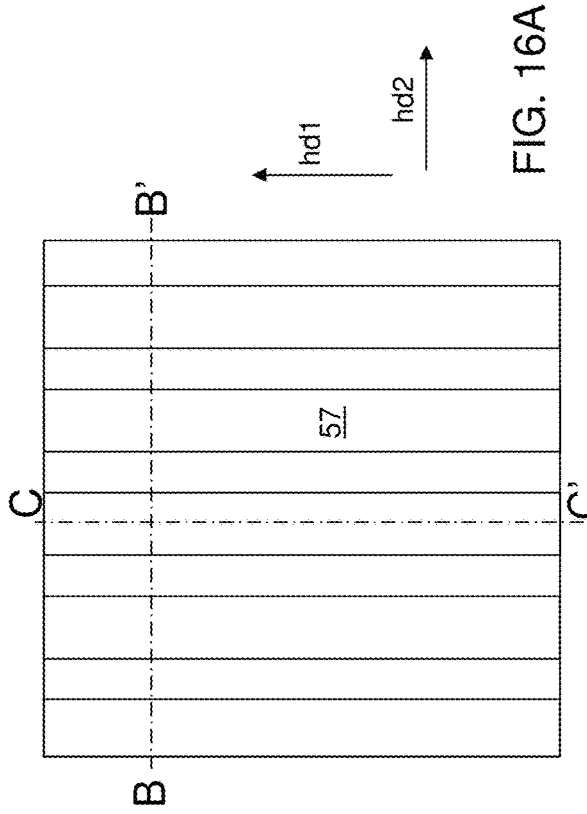
FIG. 16A is a top-down view of a portion of an alternative configuration of the exemplary structure after formation of a sacrificial conformal etch mask liner according to an embodiment of the present disclosure.
Figure 16C:
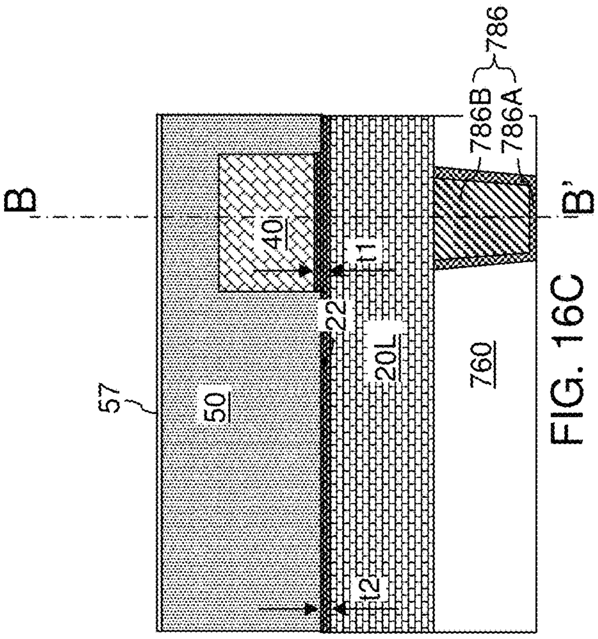
FIG. 16C is a vertical cross-sectional view of the exemplary structure along the vertical plane C-C' of FIG. 16A.
Figure 16B:
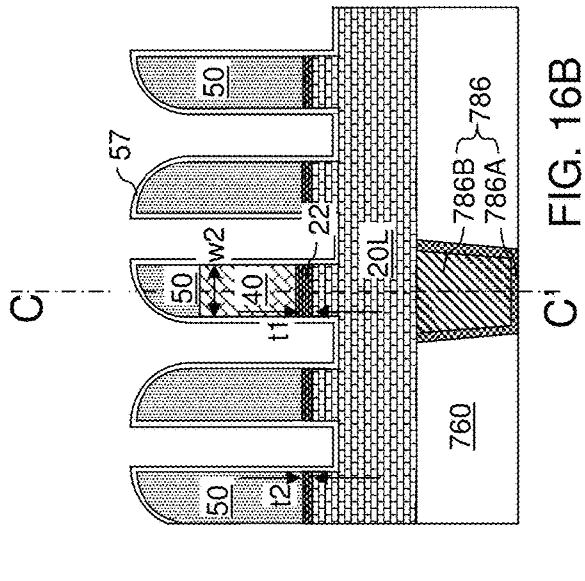
FIG. 16B is a vertical cross-sectional view of the exemplary structure along the vertical plane B-B' of FIG. 16A.

Referring to FIGS. 16A-16C, an alternative configuration of the exemplary structure is illustrated, which can be derived from the exemplary structure illustrated in FIGS. 11A-11C by forming a sacrificial conformal etch mask liner 57. The sacrificial conformal etch mask liner 57 may be deposited by performing a conformal deposition process, such as atomic layer deposition. The sacrificial conformal etch mask liner 57 may comprise a dielectric material, such as silicon oxide. The sacrificial conformal etch mask layer 57 may be used to eliminate and/or reduce collateral lateral thinning of the metal via structures 40 during the third etch step of the second anisotropic etch process. For example, if the metal line structures 20 and the metal via structures 40 comprise molybdenum which is etched using a direct metal etch, the sacrificial conformal etch mask layer 57 may be used eliminate and/or reduce collateral lateral thinning of the molybdenum structures during the direct metal etching.

Generally, a sacrificial conformal etch mask liner 57 may be formed after a first subset of processing steps of the second anisotropic etch process on physically exposed surfaces of the metal via structure 40, the metallic capping plate 22, and recessed surfaces of the first metal layer 20L. The sacrificial conformal etch mask liner 57 is at least partly collaterally consumed during a second subset of the processing steps of the second anisotropic etch process that is performed after formation of the sacrificial conformal etch mask liner 57 (such as a latter portion of the third etch step of the second anisotropic etch process that is performed after formation of the sacrificial conformal etch mask liner 57). Vertically-extending portions of the sacrificial conformal etch mask liner 57 protect sidewalls of the metal via structure 40 during the second subset of the processing steps of the second anisotropic etch process.

Figures 17A, 17B, 17C:
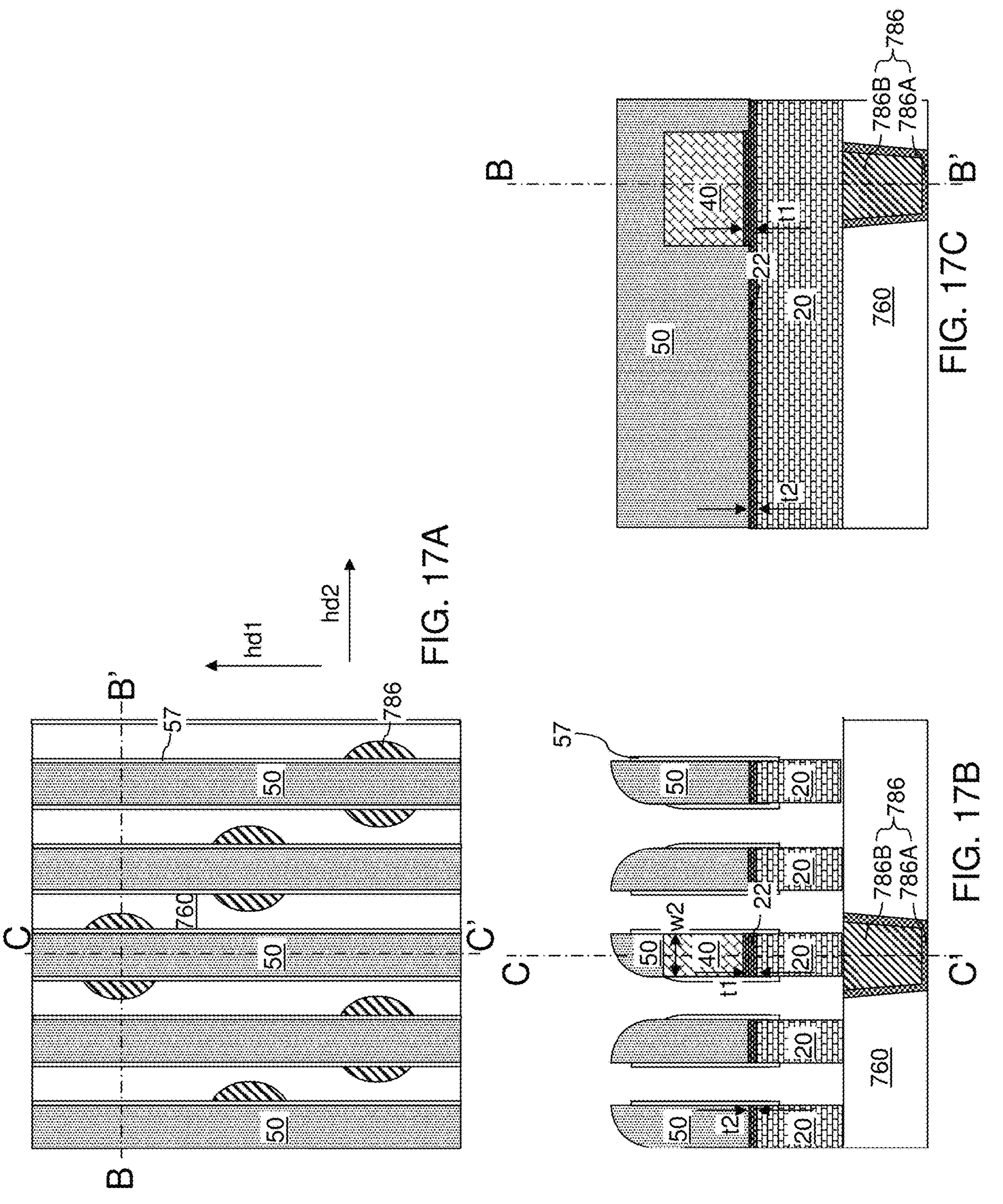
FIG. 17A is a top-down view of a portion of an alternative configuration of the exemplary structure after formation of the metal line structures according to an embodiment of the present disclosure.
FIG. 17B is a vertical cross-sectional view of the exemplary structure along the vertical plane B-B' of FIG. 17A.
FIG. 17C is a vertical cross-sectional view of the exemplary structure along the vertical plane C-C' of FIG. 17A.

Referring to FIGS. 17A-17C, the alternative configuration of the exemplary structure is illustrated after formation the second anisotropic etch process, i.e., after formation of the metal line structures 20. The vertically-extending portions of the sacrificial conformal etch mask liner 57 can be removed selective to the integrated line-and-via structures (20, 22, 40) by performing an isotropic etch process. In general, the sacrificial conformal etch mask liner 57 may be removed by the above described selective etching or by liftoff of the line-and-space-pattern etch mask 50 after etching of the structures (20, 40) is completed. Subsequently, the processing steps described with reference to FIGS. 13A-15C can be performed.

FIGS. 18A to 18E are vertical cross-sectional views of steps in a method of forming another alternative configuration of the exemplary structure according to an alternative embodiment of the present disclosure. In this alternative embodiment, the metal line structures 20 may be etched prior to forming the metal via structures 40.

Figure 18B:
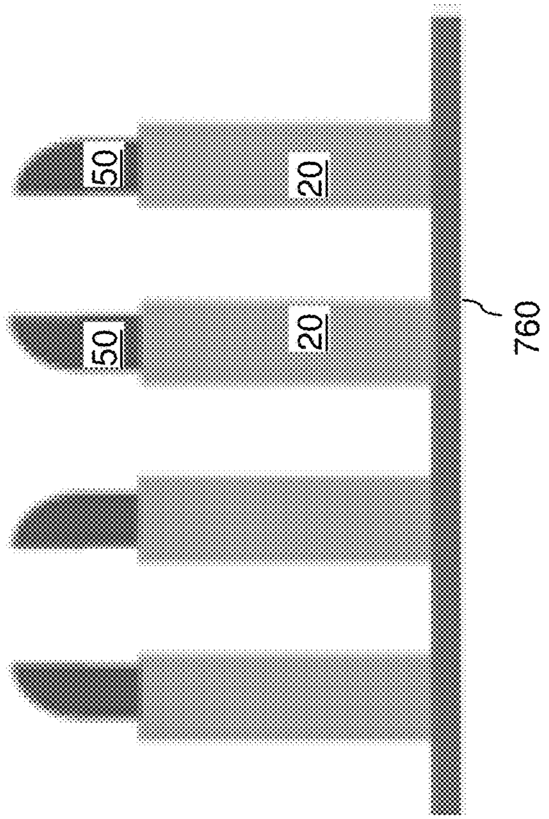
FIGS. 18A to 18E are vertical cross-sectional views of steps in a method of forming another alternative configuration of the exemplary structure according to an alternative embodiment of the present disclosure.
Figure 18A:
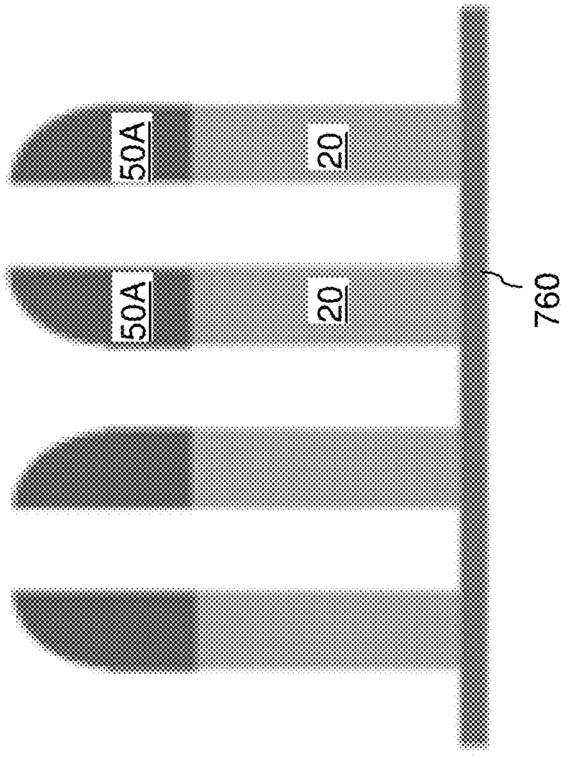

The in-process alternative exemplary structure shown in FIG. 18A may be derived from the in-process exemplary structure shown in FIG. 12B by omitting formation of the metallic capping plates 22 and the metal via structures 40. The initial line-and-space-pattern etch mask 50A may be used to etch the first metal layer 20L to form the metal line structures 20.

Referring to FIG. 18B, the slimming etch process described above with respect to FIG. 9D is performed to reduce the width of the initial line-and-space-pattern etch mask 50A and to form the line-and-space-pattern etch mask 50.

Figure 18C:
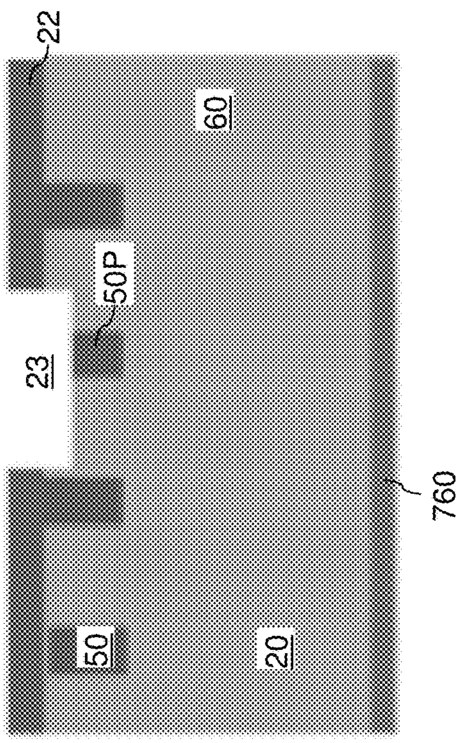

Referring to FIG. 18C, the additional dielectric material layer 60 is formed around the metal line structures 20 and the line-and-space-pattern etch mask 50. The top ends of the line-and-space-pattern etch mask 50 are exposed in the top surface of the additional dielectric material layer 60 by planarization (e.g., CMP). The metallic capping plate (i.e., hard mask layer) 22 is formed over the additional dielectric material layer 60 and patterned to form at least one line shaped opening 23 exposing a respective line-and-space-pattern etch mask 50 portion 50P. The line shaped opening 23 may extend into the additional dielectric material layer 60 and partially into the line-and-space-pattern etch mask 50 portion 50P.

Figure 18D:
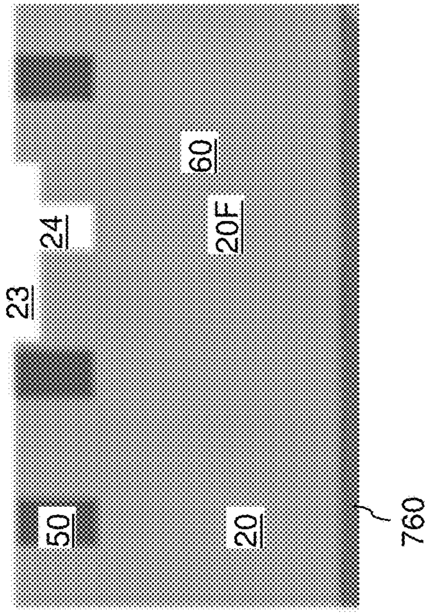

Referring to FIG. 18D, the exposed line-and-space-pattern etch mask 50 portion 50P is removed through the line shaped opening 23 by selective etching to form a via shaped opening 24. The top surface of a first metal line structure 20F is exposed at the bottom of the via shaped opening 24. The metallic capping plate 22 is then removed by selective etching.

Figure 18E:
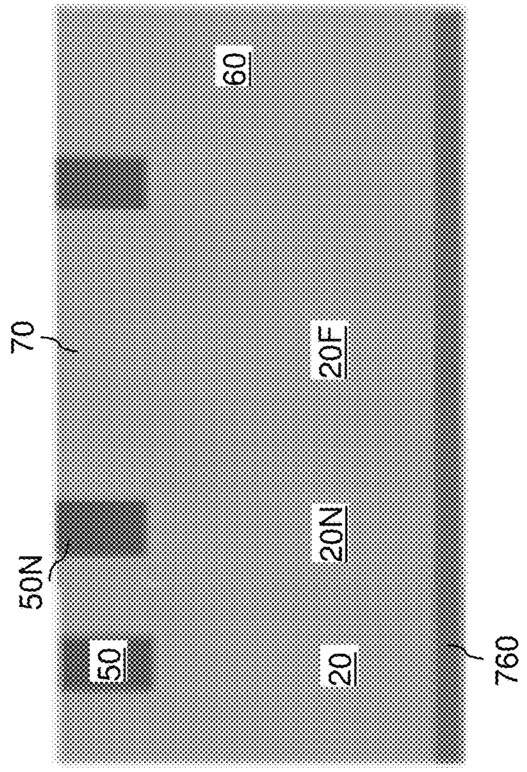

Referring to FIG. 18E, an electrically conductive material (e.g., metal and/or metal nitride) is deposited into the line shaped opening 23 and the via shaped opening 24. The electrically conductive material is then planarized (e.g., by CMP) to form a dual damascene metal line and via structure 70 in contact with the first metal line structure 20F exposed at the bottom of the via shaped opening 24.

Due to the slimming of the initial line-and-space-pattern etch mask 50A, the line-and-space-pattern etch mask 50 neighboring portion 50N located next to the line shaped opening 23 is not removed during the selective etch of the portion 50P. In other words, the slimming etch recesses the sidewalls of the neighboring portion 50N from the portion 50P. This recessing of the sidewalls of the neighboring portion 50N moves the sidewalls further from the line shaped opening 23 and prevents exposure of the neighboring portion 50N in the line shaped opening 23. This reduces the chance of the dual damascene metal line and via structure 70 short circuiting adjacent metal line structures 20F and 20N.

Referring to all drawings and according to various embodiments of the present disclosure, a structure is provided, which comprises an integrated line-and-via structure (20, 22, 40) located over a substrate 8. The integrated line-and-via structure (20, 22, 40) comprises: a metal line structure 20 comprising a first metal and having a pair of lengthwise metal line sidewalls that laterally extend along a first horizontal direction hd1; a metallic capping plate 22 comprising a metallic capping material and overlying the metal line structure 20 and having a pair of lengthwise metal cap sidewalls that are vertically coincident with the pair of lengthwise metal line sidewalls; and a metal via structure 40 comprising a second metal and having a pair of lengthwise metal via sidewalls that is vertically coincident with the pair of lengthwise metal cap sidewalls and having a lateral extent along the first horizontal direction hd1 that is less than a lateral extent of the metal line structure 20 along the first horizontal direction hd1.

In one embodiment, an entirety of the pair of lengthwise metal via sidewalls and an entirety of the pair of lengthwise metal line sidewalls are located within a pair of vertical planes that laterally extend along the first horizontal direction hd1. In one embodiment, the metallic capping plate 22 has a first thickness in a first area that underlies the metal via structure 40 and has a second thickness in a second area that does not have an areal overlap with the metal via structure 40, the second thickness being less than the first thickness.

In one embodiment, the structure further comprises a dielectric material layer 60 having a homogeneous material composition throughout and having a bottom surface with a horizontal plane including a bottom surface of the metal line structure 20 and having a top surface within a horizontal plane including a top surface of the metal via structure 40. In one embodiment, a top surface of the metallic capping plate 22 is in contact with a horizontal surface of the dielectric material layer 60. In one embodiment, a region of the metallic capping plate 22 that underlies the metal via structure 40 has a greater thickness than a region of the metallic capping plate 22 that does not have an areal overlap within the metal via structure 40; and an entirety of the pair of lengthwise metal line sidewalls, the pair of lengthwise metal cap sidewalls, and the pair of lengthwise metal via sidewalls is in contact with the dielectric material layer 60.

In one embodiment, the first metal and the second metal comprise Mo, W, or Ru. In one embodiment, the first metal and the second metal comprise the Ru and the metallic capping material comprises TiN. In another embodiment, first metal and the second metal comprise the W or the Mo, and the metallic capping material comprises Co or Ru.

In one embodiment shown in FIG. 14D, a three-dimensional memory device 710 is located between the substrate 8 and the integrated line-and-via structure (20, 22, 40).

The various embodiments of the present disclosure may be employed to provide self-aligned electrical contact between high-density metal lines and overlying metal via structures. A non-limiting example of such a configuration is a metal interconnect structure including bit lines for a three-dimensional memory array and overlying metal via structures. Generally, the integrated line-and-via structures (20, 22, 40) of the embodiments of the present disclosure may be employed in any configuration in which multiple parallel metal lines and overlying metal via structures are necessary within a metal interconnect structure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure, comprising:

an integrated line-and-via structure located over a substrate, wherein the integrated line-and-via structure comprises:

a metal line structure comprising a first metal and having a pair of lengthwise metal line sidewalls that laterally extend along a first horizontal direction;

a metallic capping plate comprising a metallic capping material and overlying the metal line structure and having a pair of lengthwise metal cap sidewalls that are vertically coincident with the pair of lengthwise metal line sidewalls; and a metal via structure comprising a second metal and having a pair of lengthwise metal via sidewalls that is vertically coincident with the pair of lengthwise metal cap sidewalls and having a lateral extent along the first horizontal direction that is less than a lateral extent of the metal line structure along the first horizontal direction; and a dielectric material layer having a homogeneous material composition throughout and having a bottom surface with a horizontal plane including a bottom surface of the metal line structure and having a top surface within a horizontal plane including a top surface of the metal via structure;

wherein:

a top surface of the metallic capping plate is in contact with a horizontal surface of the dielectric material layer;

a region of the metallic capping plate that underlies the metallic via structure has a greater thickness than a region of the metallic capping plate that does not have an areal overlap within the metallic via structure; and an entirety of the pair of lengthwise metal line sidewalls, the pair of lengthwise metal cap sidewalls, and the pair of lengthwise metal via sidewalls is in contact with the dielectric material layer.

2. The structure of claim 1, wherein the first metal and the second metal comprise Mo, W, or Ru.

3. The structure of claim 2, wherein the first metal and the second metal comprise the Ru and the metallic capping material comprises TiN.

4. The structure of claim 2, wherein the first metal and the second metal comprise the W or the Mo, and the metallic capping material comprises Co or Ru.

5. The structure of claim 1, further comprising a three-dimensional memory device located between the substrate and the integrated line-and-via structure.

* * * * *